US011296133B2

(12) United States Patent
Kimura et al.

(10) Patent No.: US 11,296,133 B2
(45) Date of Patent: Apr. 5, 2022

(54) IMAGING APPARATUS AND ELECTRONIC DEVICE

(71) Applicant: Sony Semiconductor Solutions Corporation, Kanagawa (JP)

(72) Inventors: Katsuji Kimura, Kanagawa (JP); Atsushi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 70 days.

(21) Appl. No.: 16/616,113

(22) PCT Filed: May 15, 2018

(86) PCT No.: PCT/JP2018/018638
§ 371 (c)(1),
(2) Date: Nov. 22, 2019

(87) PCT Pub. No.: WO2018/221191
PCT Pub. Date: Dec. 6, 2018

(65) Prior Publication Data
US 2020/0176496 A1 Jun. 4, 2020

(30) Foreign Application Priority Data

May 29, 2017 (JP) .............................. JP2017-105713

(51) Int. Cl.
*H01L 27/146* (2006.01)
*G02B 1/118* (2015.01)
(Continued)

(52) U.S. Cl.
CPC ........ *H01L 27/14618* (2013.01); *G02B 1/118* (2013.01); *G02B 5/208* (2013.01);
(Continued)

(58) Field of Classification Search
CPC ........... H01L 27/14618; H01L 27/1462; H01L 27/14625; H01L 27/14634; G02B 1/118; G02B 5/208; H04N 5/2253
(Continued)

(56) References Cited

U.S. PATENT DOCUMENTS 8,546,739 B2 10/2013 Hsuan
2009/0305451 A1 12/2009 Hsuan et al.
(Continued)

FOREIGN PATENT DOCUMENTS

CN 101632294 A 1/2010
CN 201662645 U 12/2010
(Continued)

OTHER PUBLICATIONS

Japanese Office Action dated Apr. 5, 2021 in connection with Japanese Application No. 2017-105714 and English translation thereof.
(Continued)

*Primary Examiner* — Thinh T Nguyen
(74) *Attorney, Agent, or Firm* — Wolf, Greenfield & Sacks, P.C.

(57) ABSTRACT

There is provided an imaging apparatus including: a solid state image sensor configured to generate a pixel signal by photoelectric conversion in accordance with a light amount of an incoming light; an integrated configuration unit configured to integrate a function for fixing the solid state image sensor and a function for removing an infrared light of the incoming light.

17 Claims, 23 Drawing Sheets

(51) Int. Cl.
G02B 5/20 (2006.01)
H04N 5/225 (2006.01)
B60R 1/00 (2022.01)
B60R 11/04 (2006.01)

(52) U.S. Cl.
CPC .... *H01L 27/1462* (2013.01); *H01L 27/14625* (2013.01); *H01L 27/14634* (2013.01); *H04N 5/2253* (2013.01); *H04N 5/2254* (2013.01); *B60R 1/00* (2013.01); *B60R 11/04* (2013.01)

(58) Field of Classification Search
USPC .............. 257/432, 433, 437; 438/48, 64, 69
See application file for complete search history.

(56) References Cited

U.S. PATENT DOCUMENTS

| | | | | |
|---|---|---|---|---|
| 2011/0156188 | A1* | 6/2011 | Tu et al. | ........... H01L 27/14623 257/432 |
| 2012/0211852 | A1 | 8/2012 | Iwafuchi et al. | |
| 2012/0211855 | A1 | 8/2012 | Iwafuchi et al. | |
| 2015/0138366 | A1* | 5/2015 | Keelan et al. | ........... H01N 5/33 348/164 |
| 2015/0146056 | A1* | 5/2015 | Hirota | ................... H01L 27/146 348/294 |
| 2016/0313629 | A1 | 10/2016 | Lee | |
| 2017/0102483 | A1* | 4/2017 | Kawashima et al. | .... G02B 1/04 |
| 2017/0283587 | A1 | 10/2017 | Hamada et al. | |
| 2020/0083270 | A1 | 3/2020 | Yamamoto | |

FOREIGN PATENT DOCUMENTS

| | | | |
|---|---|---|---|
| CN | 105093472 | A | 11/2015 |
| CN | 106461831 | A | 2/2017 |
| EP | 2 341 540 | A2 | 7/2011 |
| EP | 2 490 262 | A2 | 8/2012 |
| JP | 2004-207461 | A | 7/2004 |
| JP | 2008-270650 | A | 11/2008 |
| JP | 2009153178 | A | 7/2009 |
| JP | 2012014133 | A | 1/2012 |
| JP | 2012-150468 | A | 8/2012 |
| JP | 2012-169556 | A | 9/2012 |
| JP | 2012-186434 | A | 9/2012 |
| JP | 2015-061193 | A | 3/2015 |
| WO | 2016/114362 | A | 7/2016 |
| WO | 2016/129324 | A1 | 8/2016 |

OTHER PUBLICATIONS

International Search Report and Written Opinion dated Aug. 1, 2018 for International Application No. PCT/JP2018/018639.

International Preliminary Report on Patentability dated Dec. 12, 2019 in connection with International Application No. PCT/JP2018/018638.

International Preliminary Report on Patentability dated Dec. 12, 2019 in connection with International Application No. PCT/JP2018/018639.

Japanese Office Action dated Mar. 12, 2021 in connection with Japanese Application No. 2017-105713 and English translation thereof.

International Search Report and Written Opinion dated Aug. 8, 2018 in connection with International Application No. PCT/JP2018/018638.

U.S. Appl. No. 16/616,164, filed Nov. 22, 2019, Yamamoto.

Japanese Office Action dated Nov. 24, 2020 in connection with Japanese Application No. 2017-105714 and English translation thereof.

* cited by examiner

[Fig. 1]
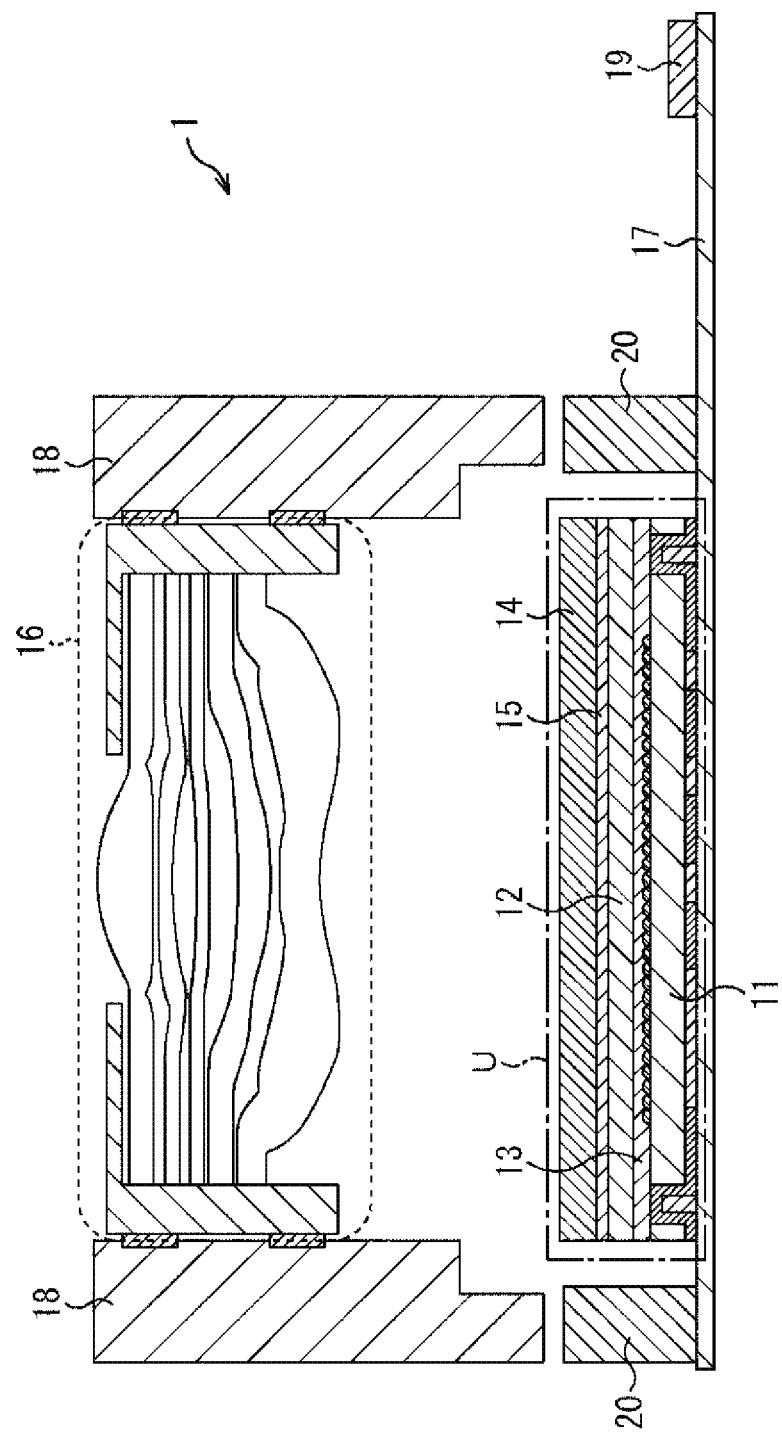

[Fig. 2]
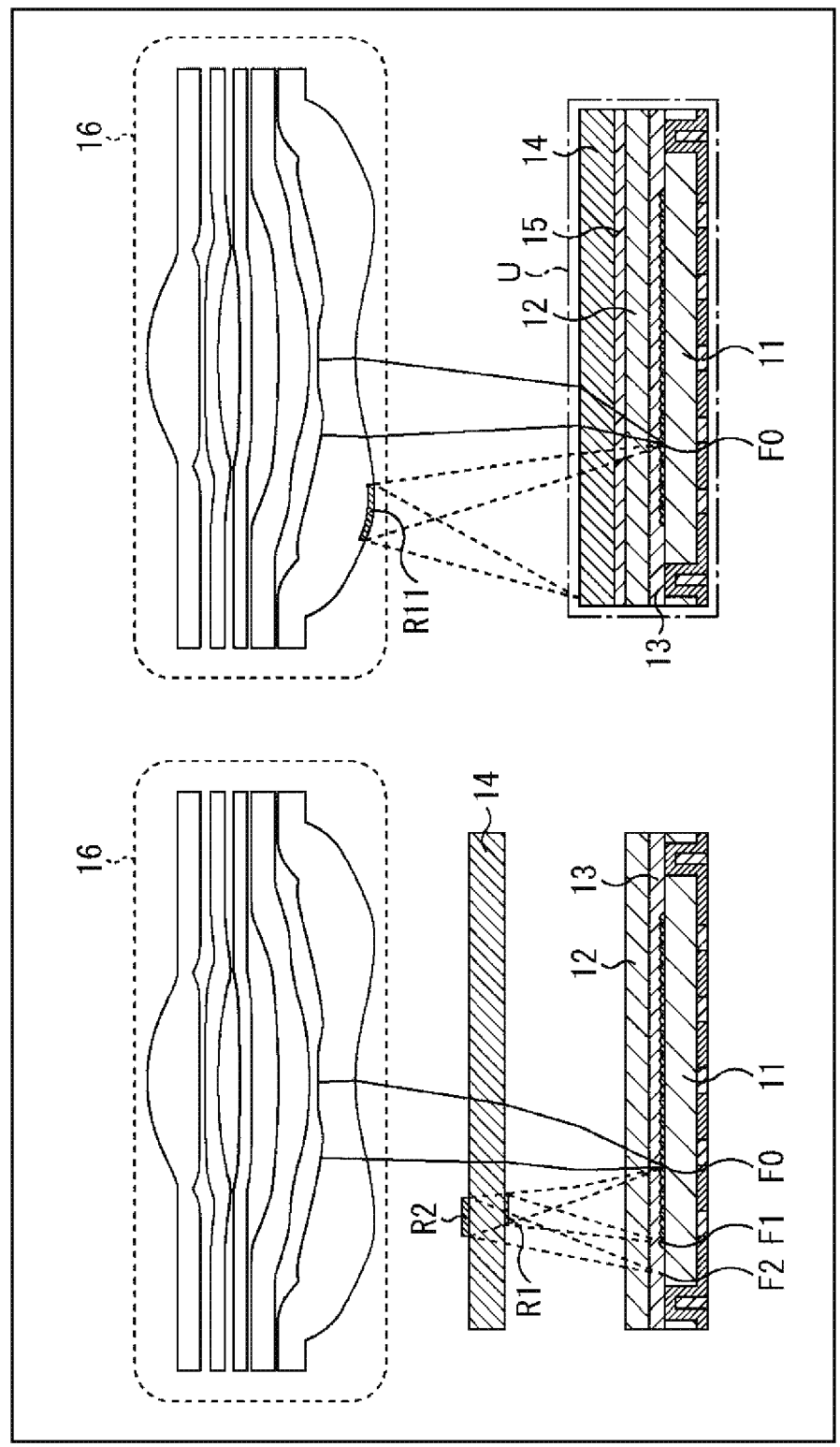

[Fig. 3]
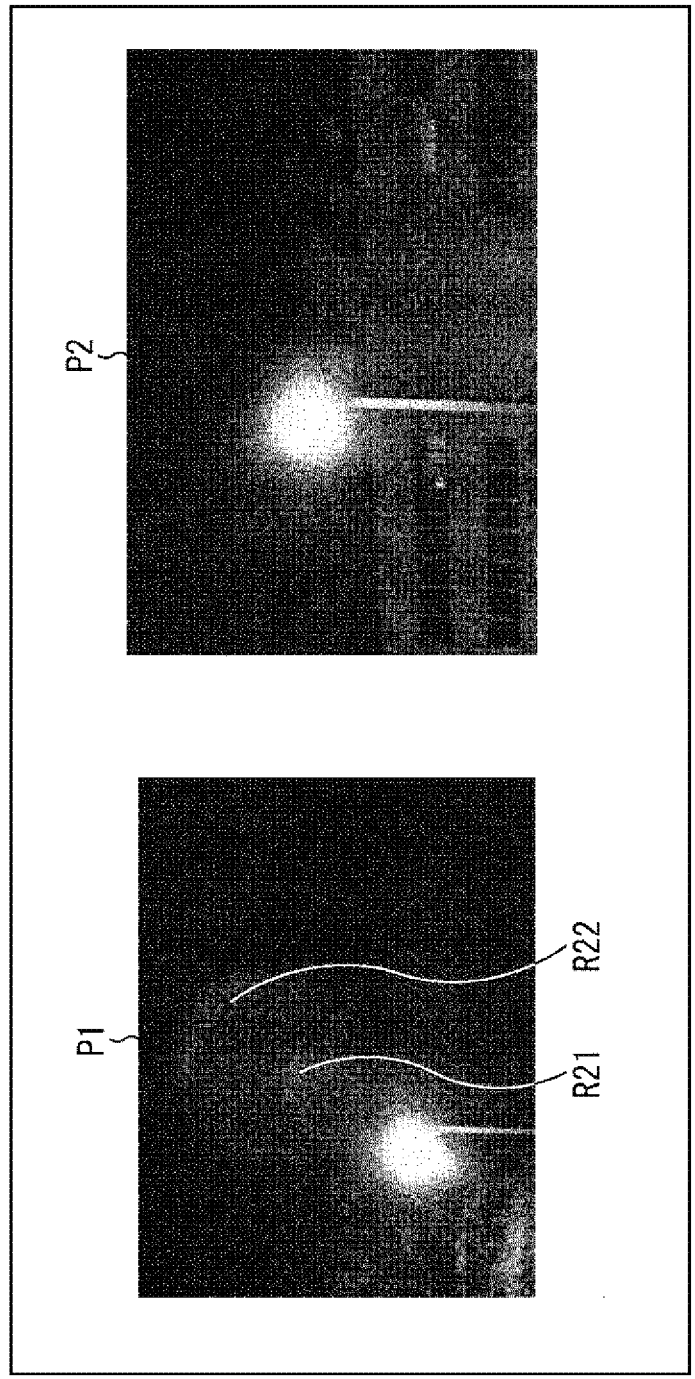

[Fig. 4]
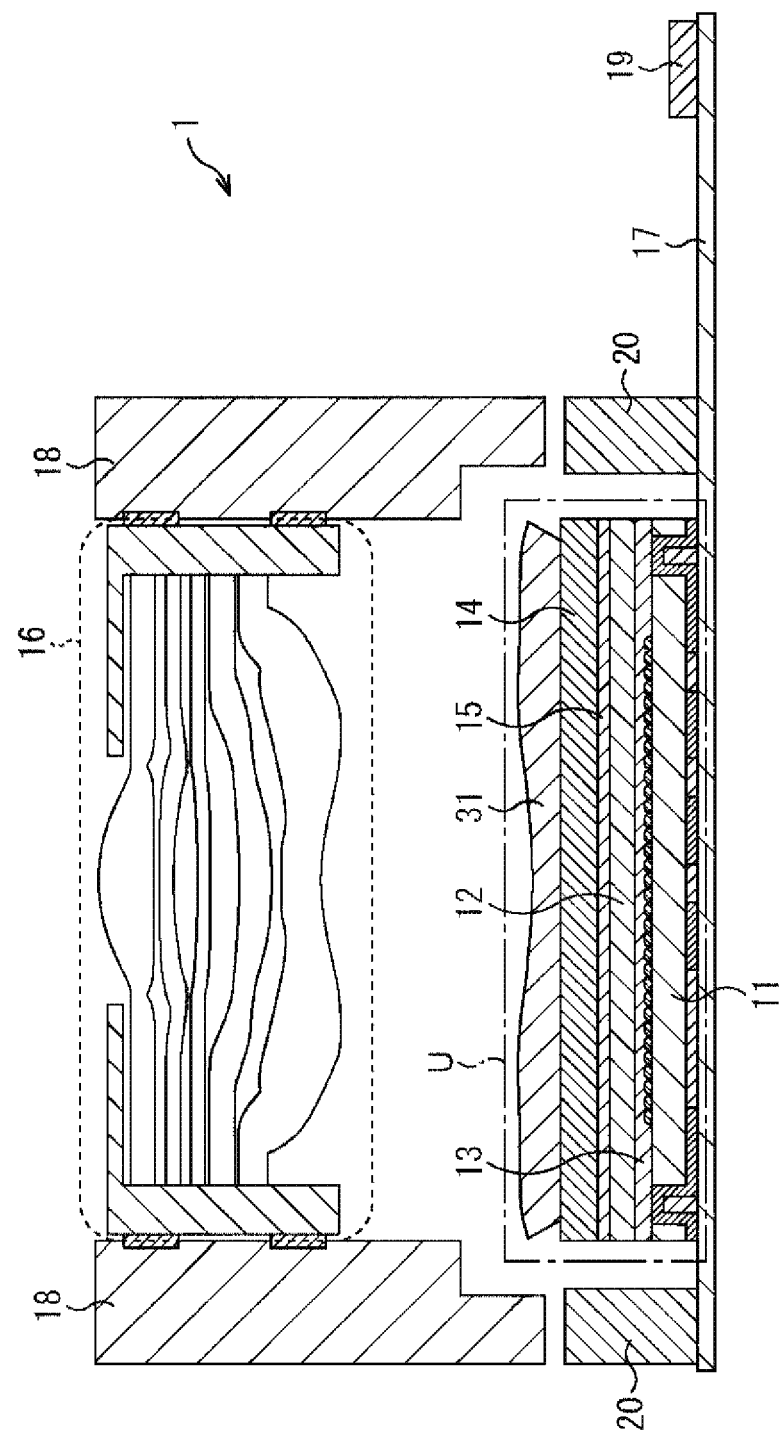

[Fig. 5]
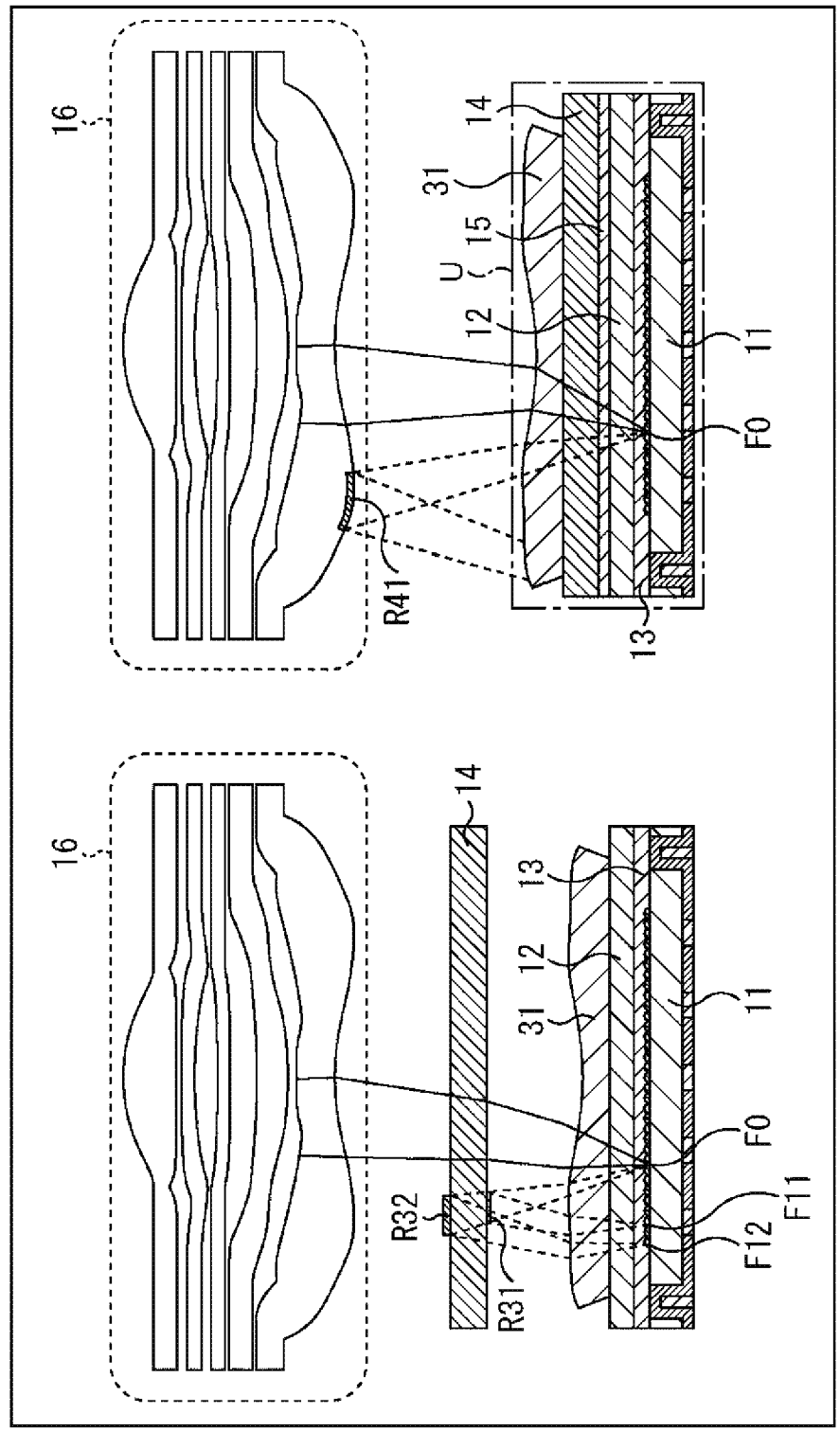

[Fig. 6]
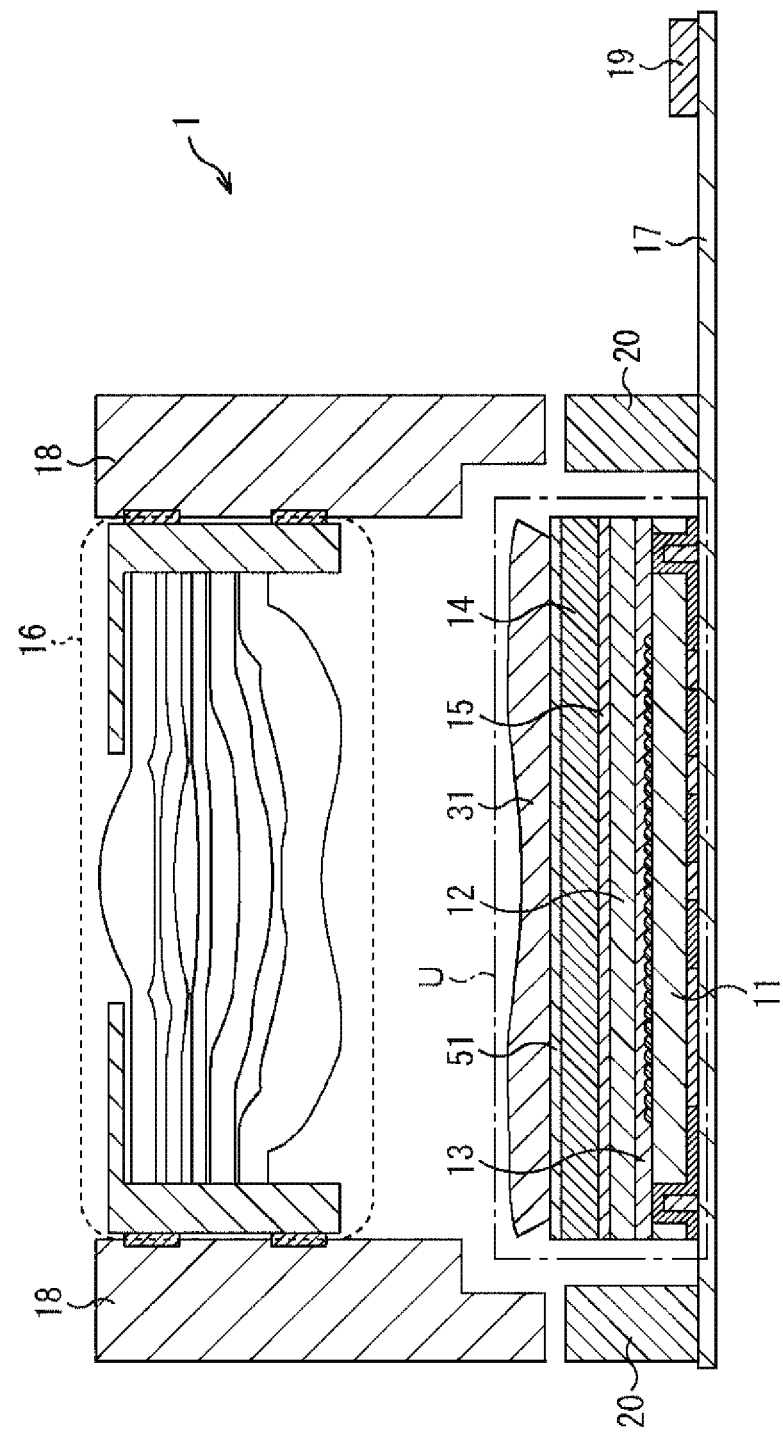

[Fig. 7]
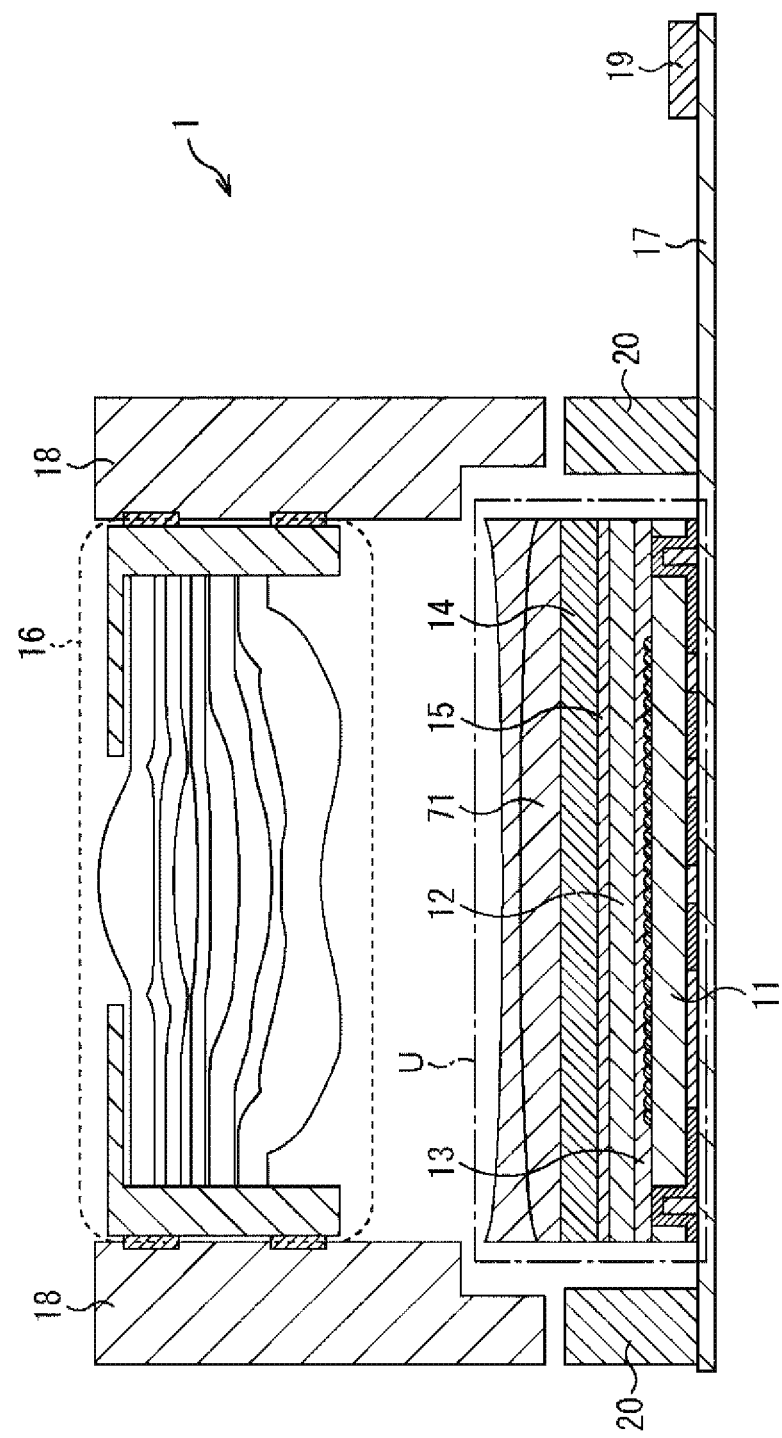

[Fig. 8]
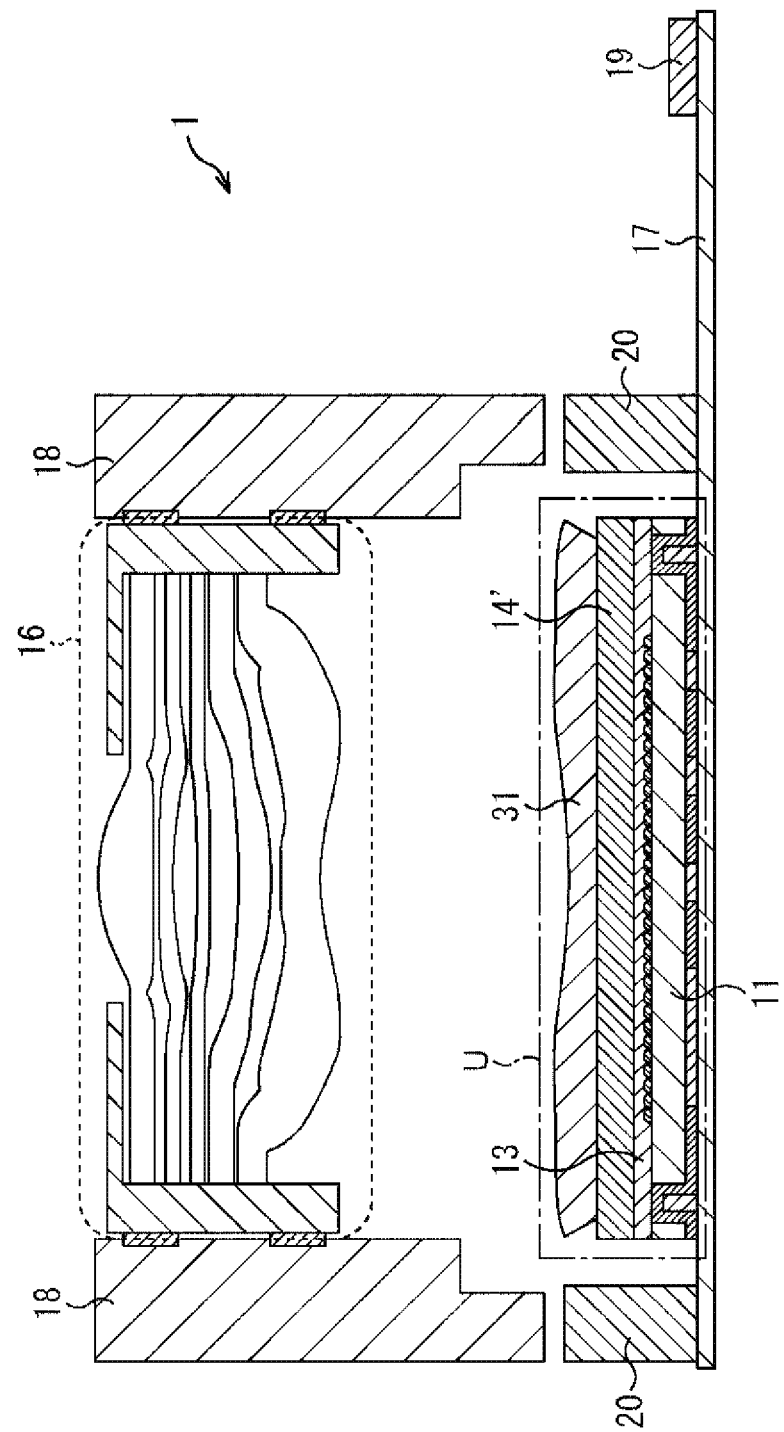

[Fig. 9]
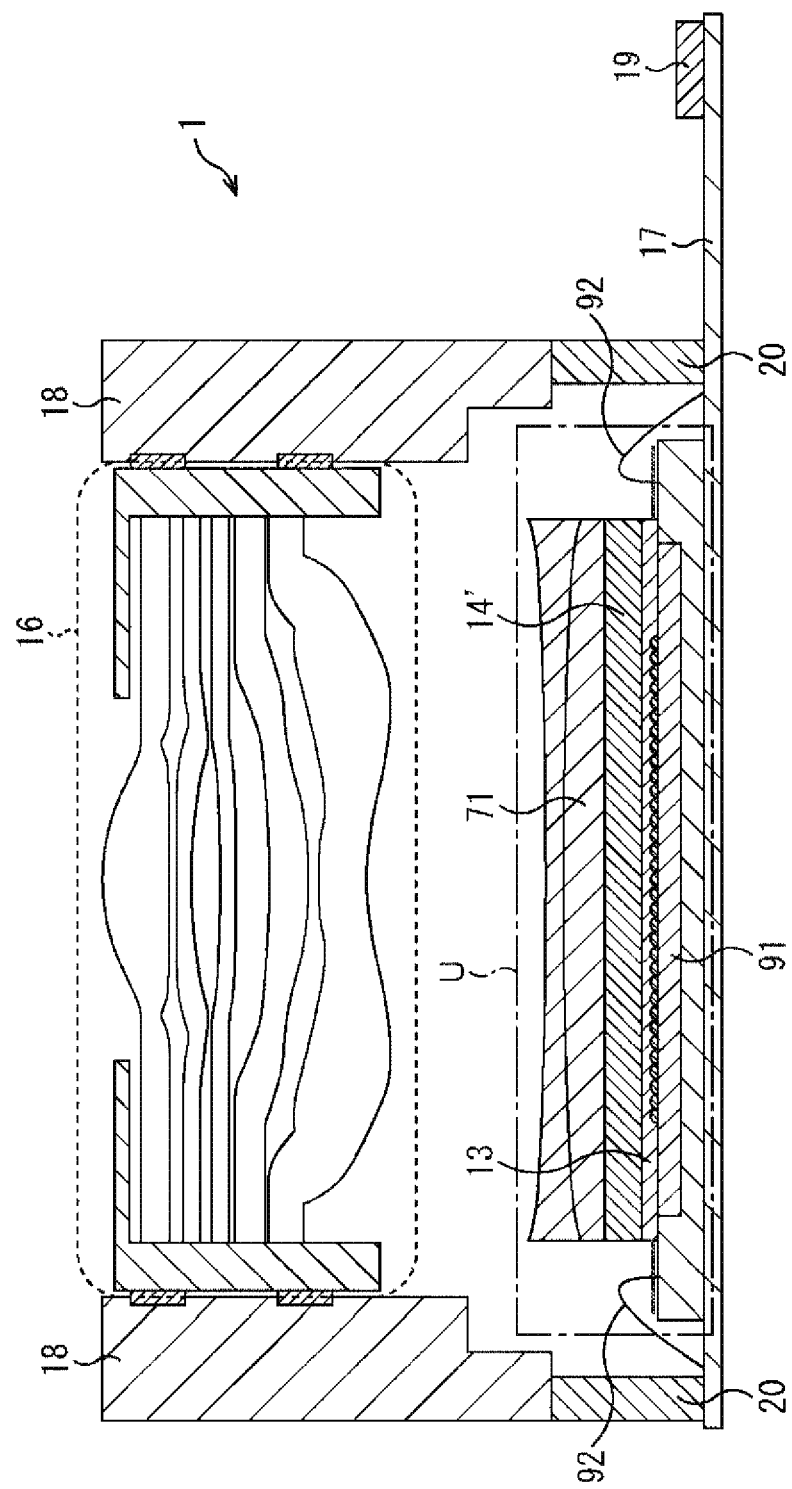

[Fig. 10]
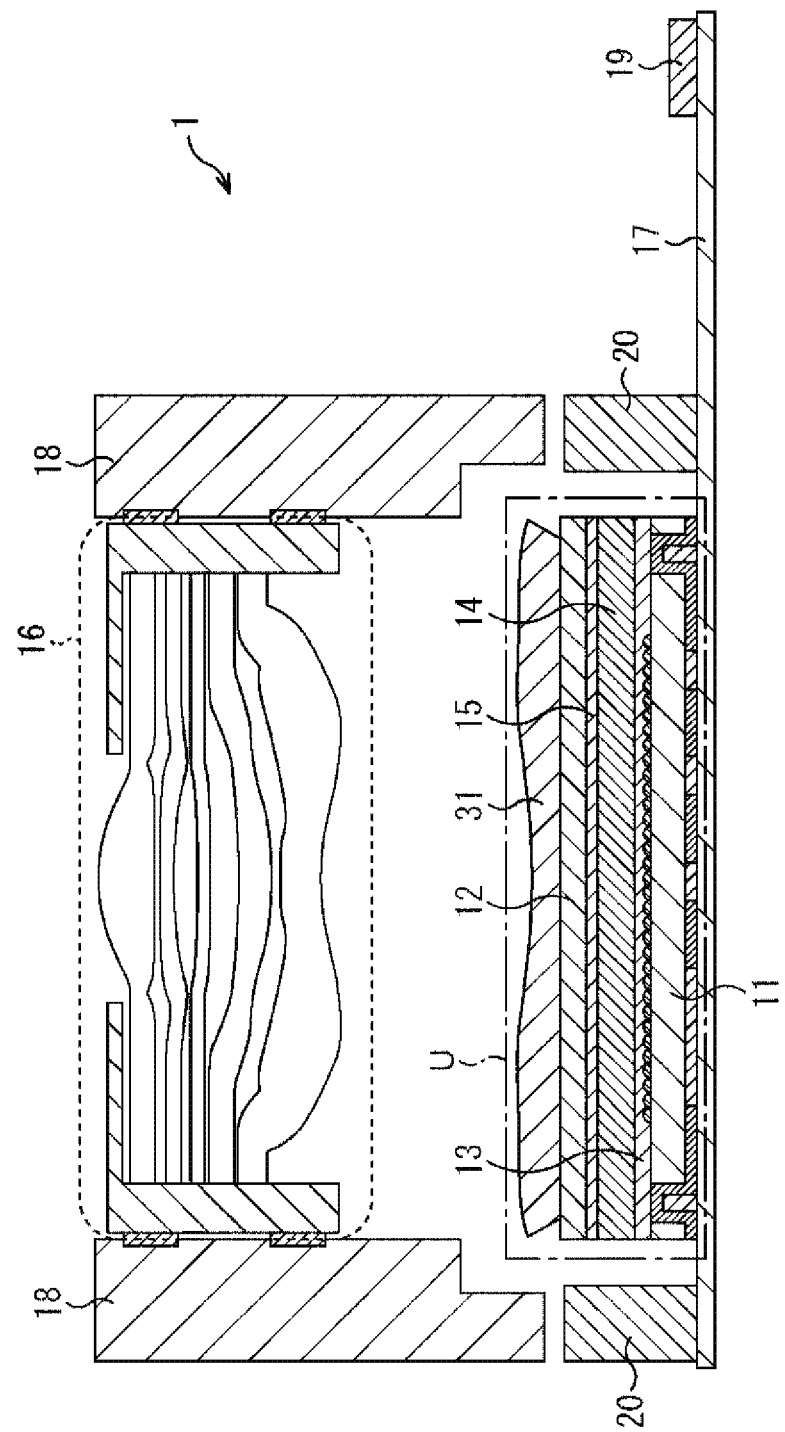

[Fig. 11]
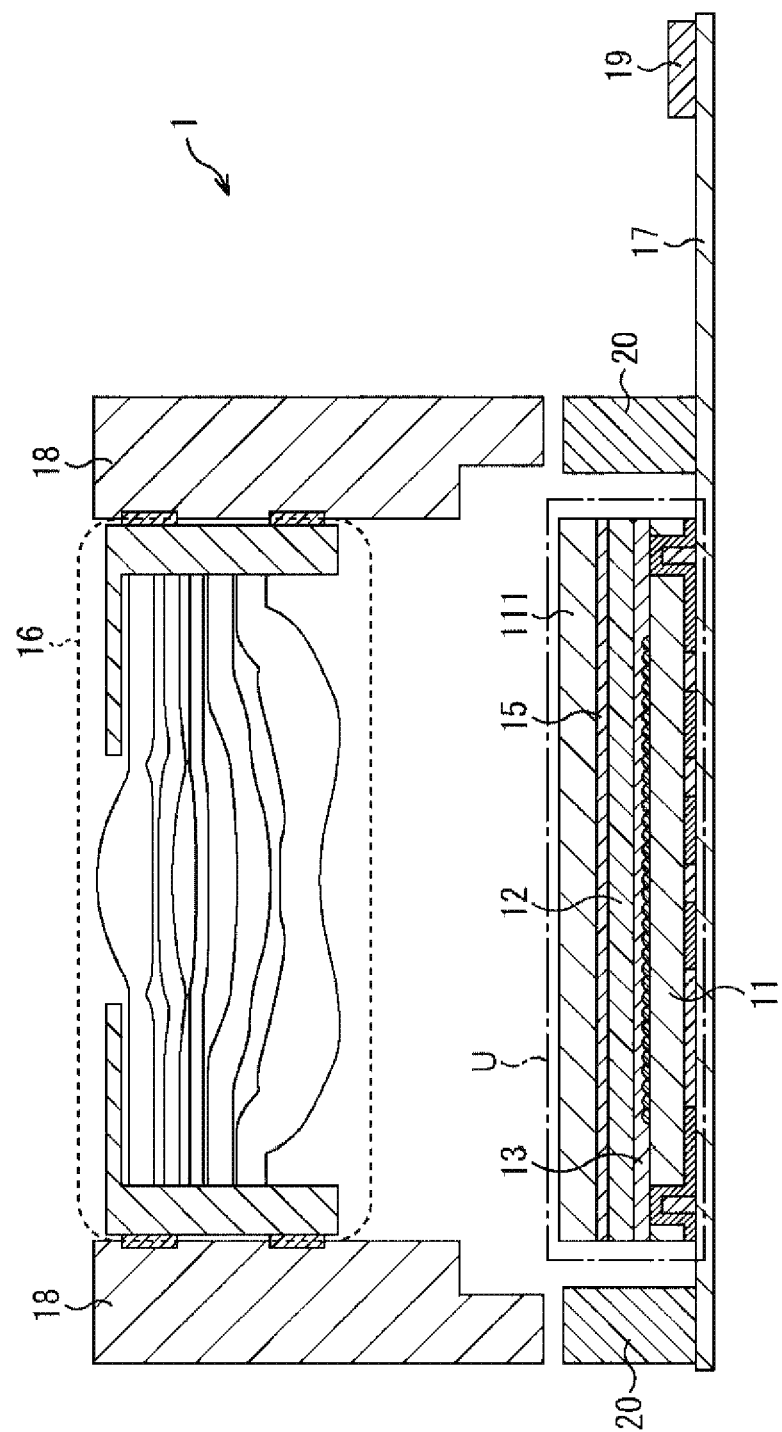

[Fig. 12]
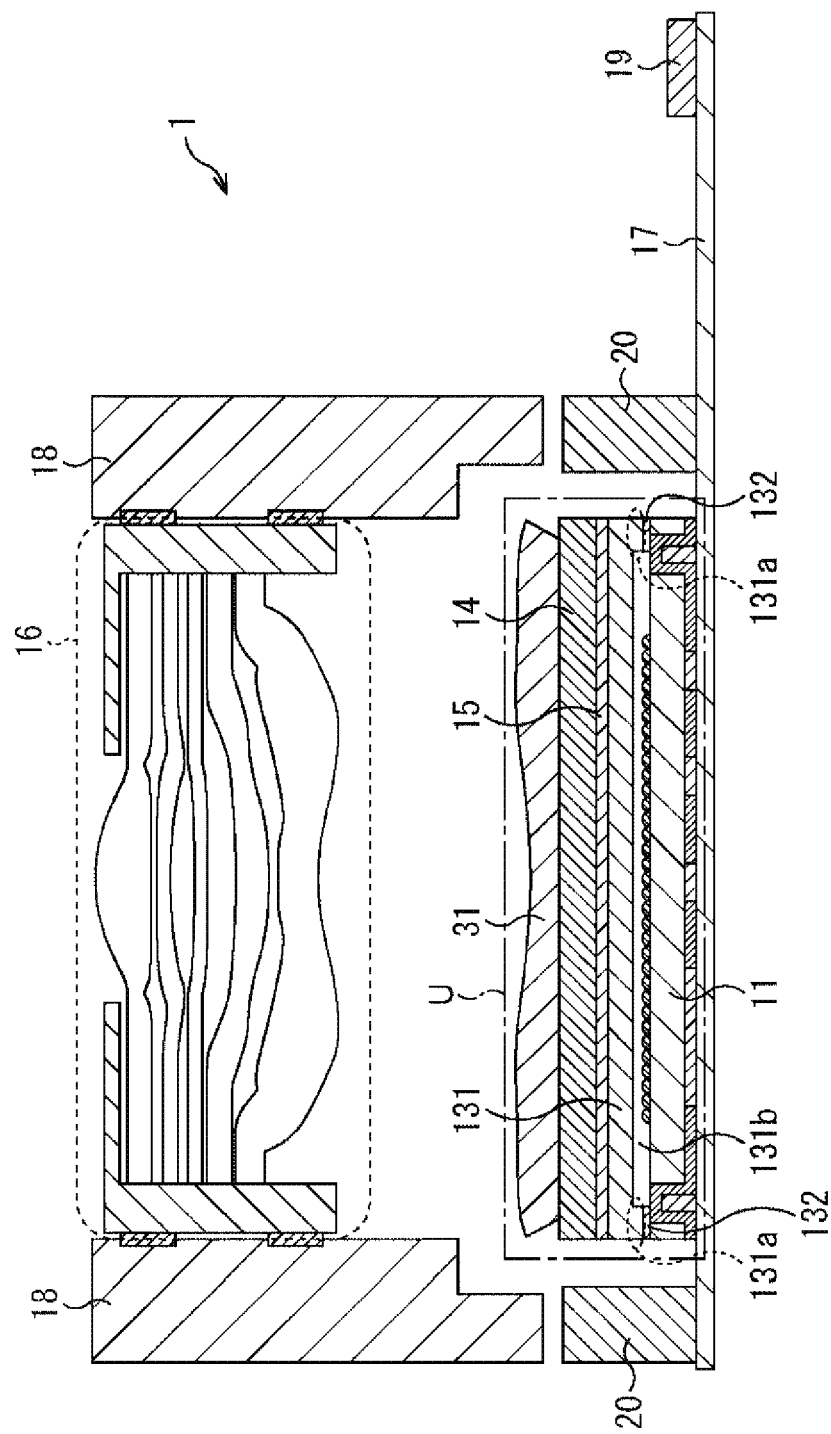

[Fig. 13]
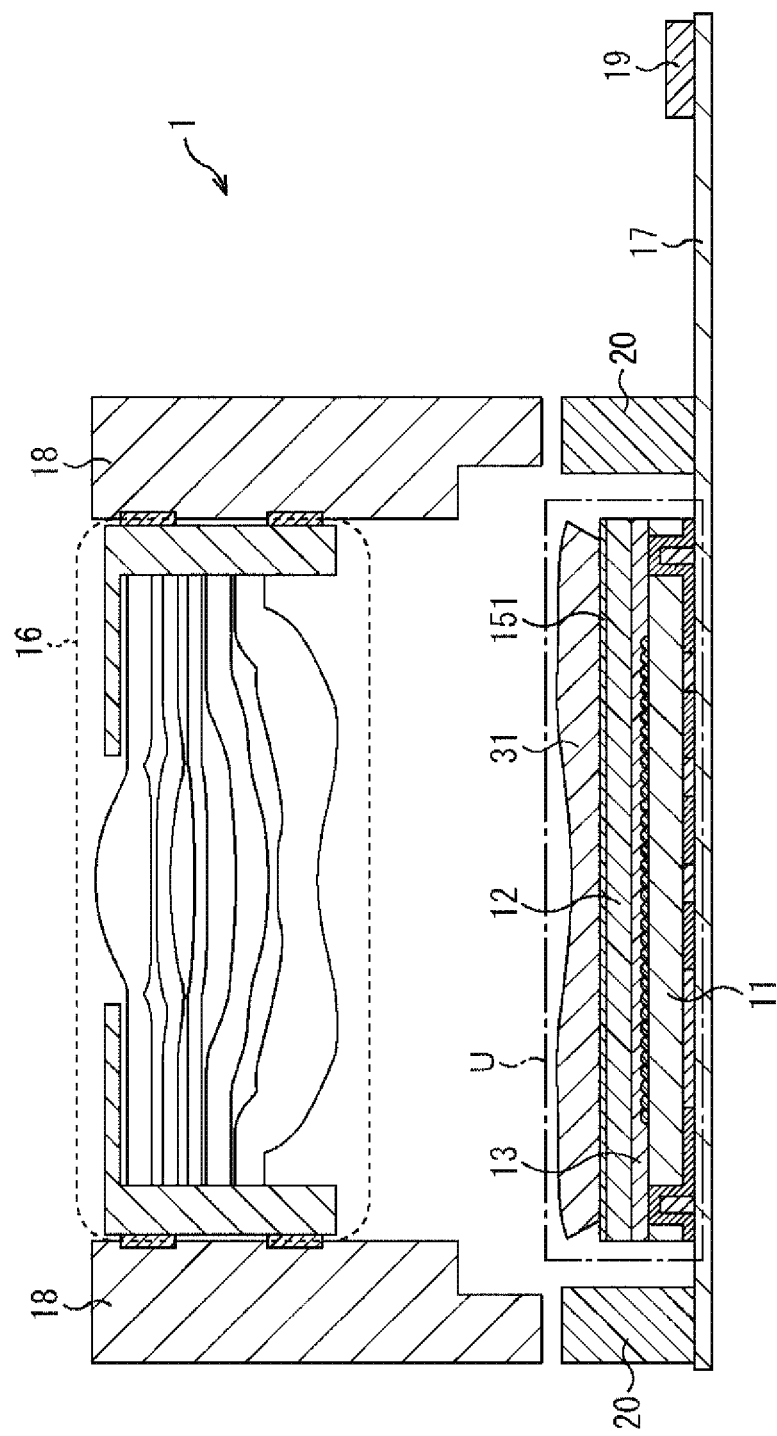

[Fig. 14]
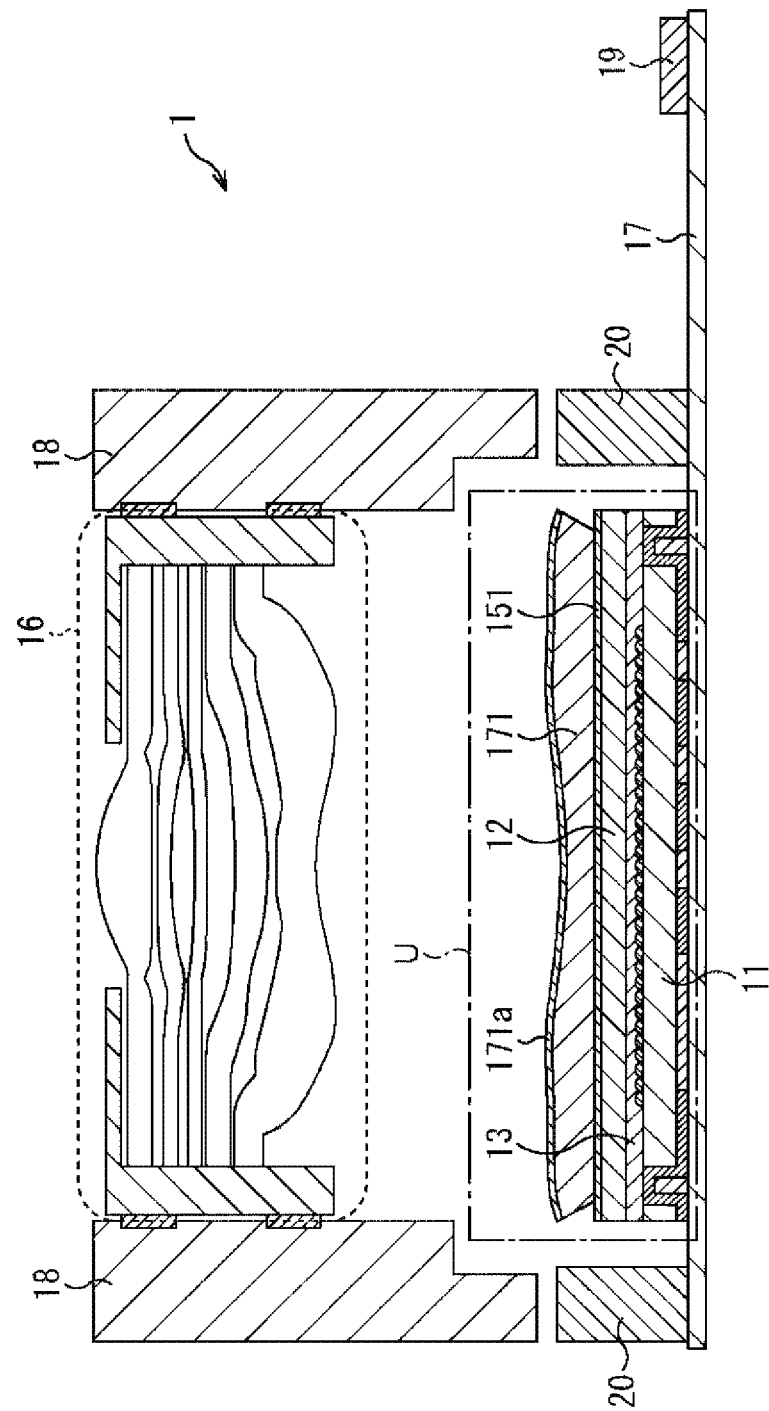

[Fig. 15]
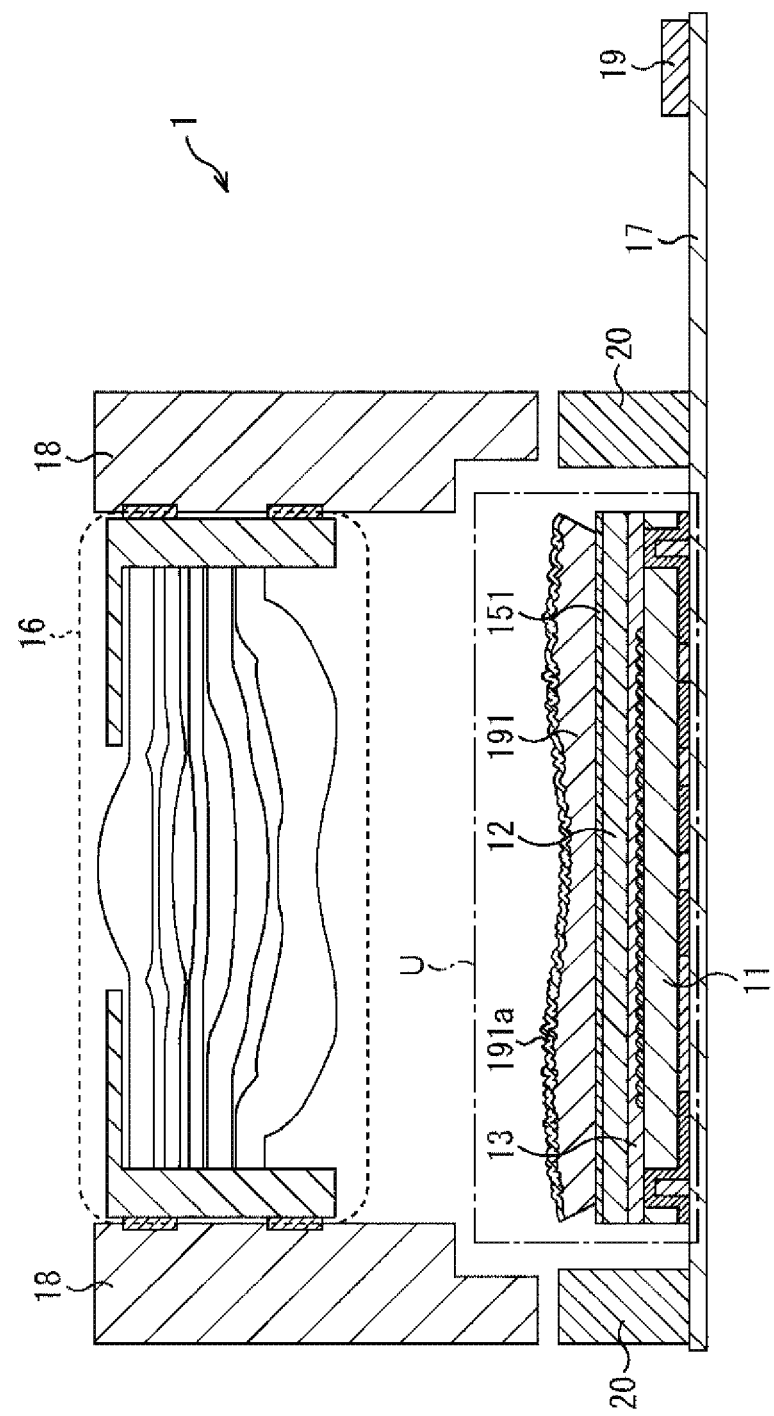

[Fig. 16]
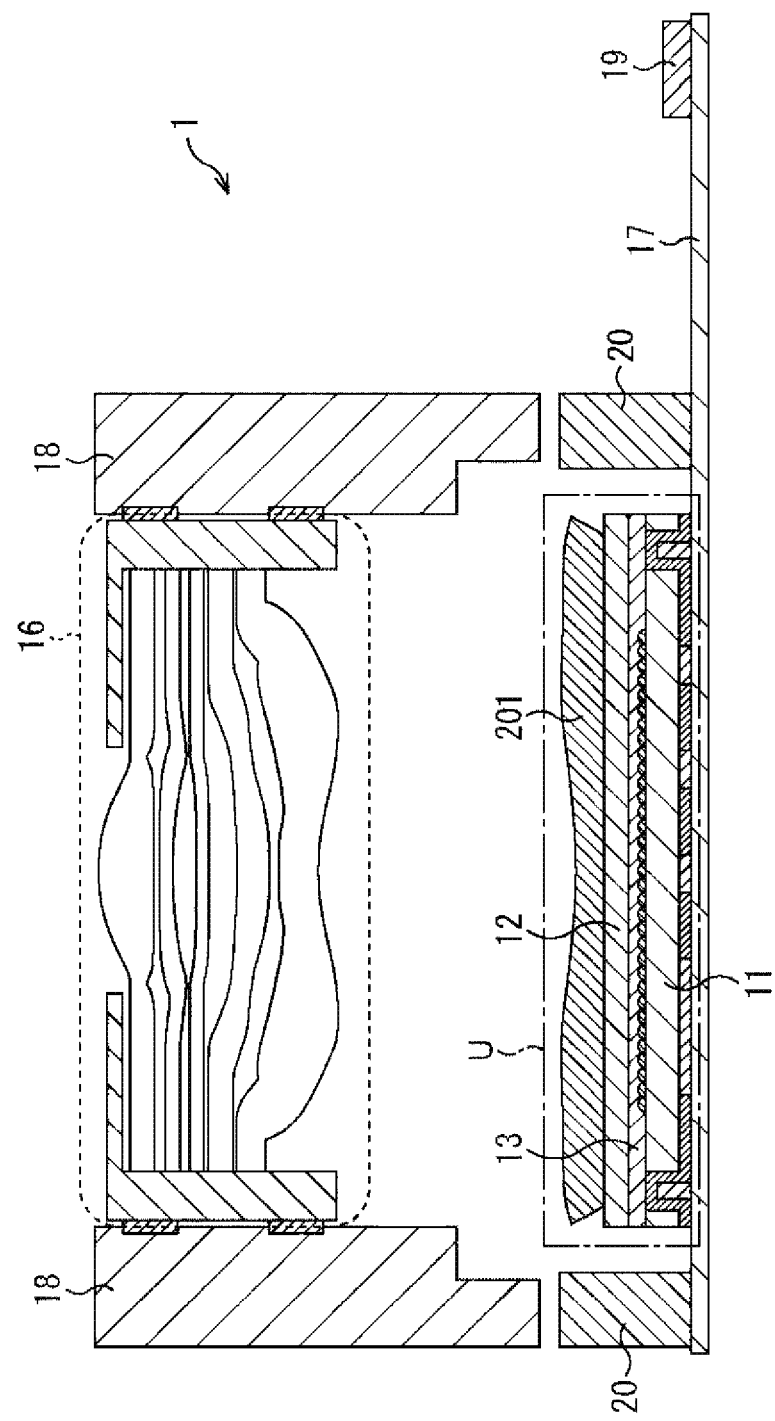

[Fig. 17]
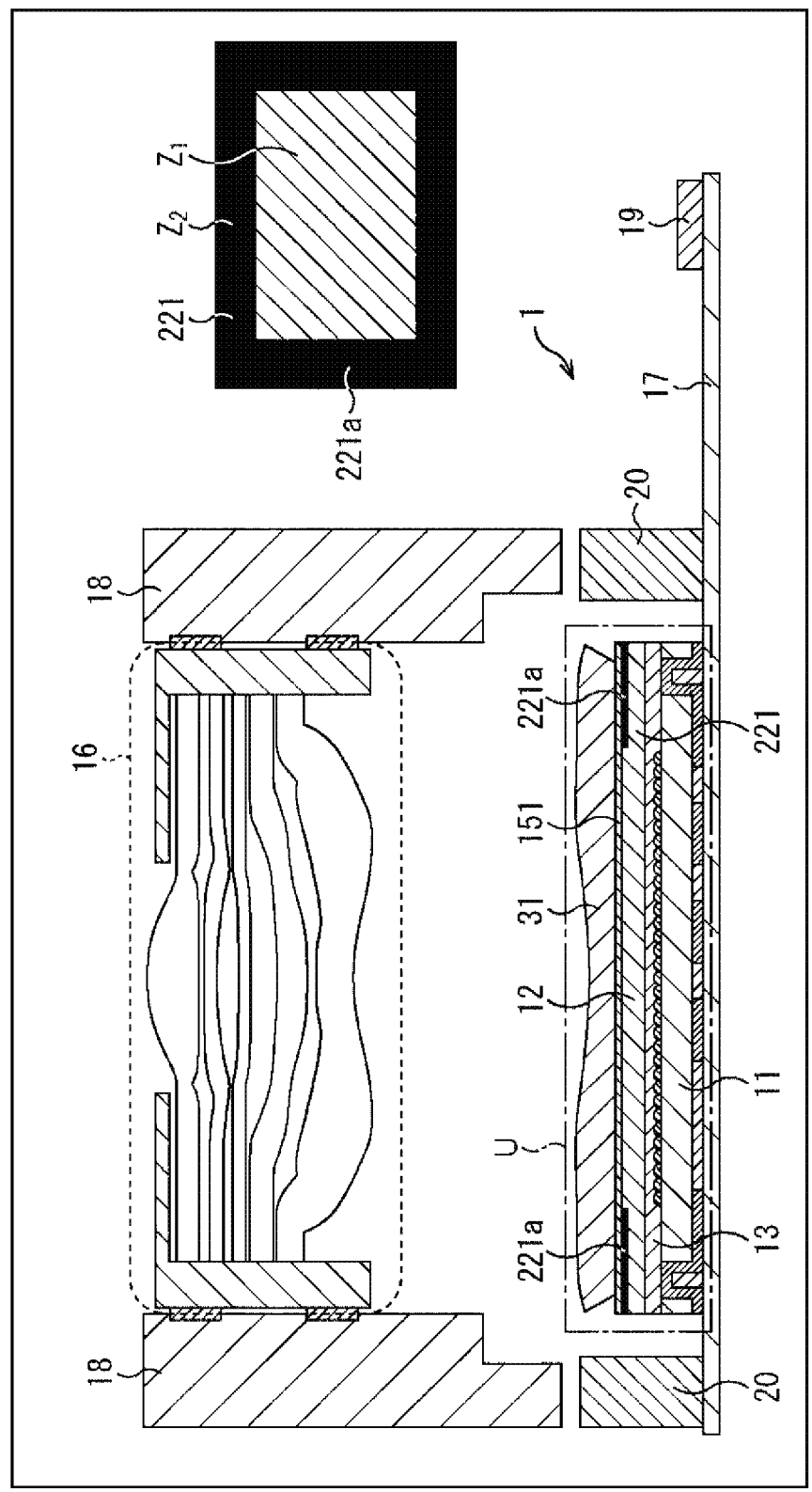

[Fig. 18]
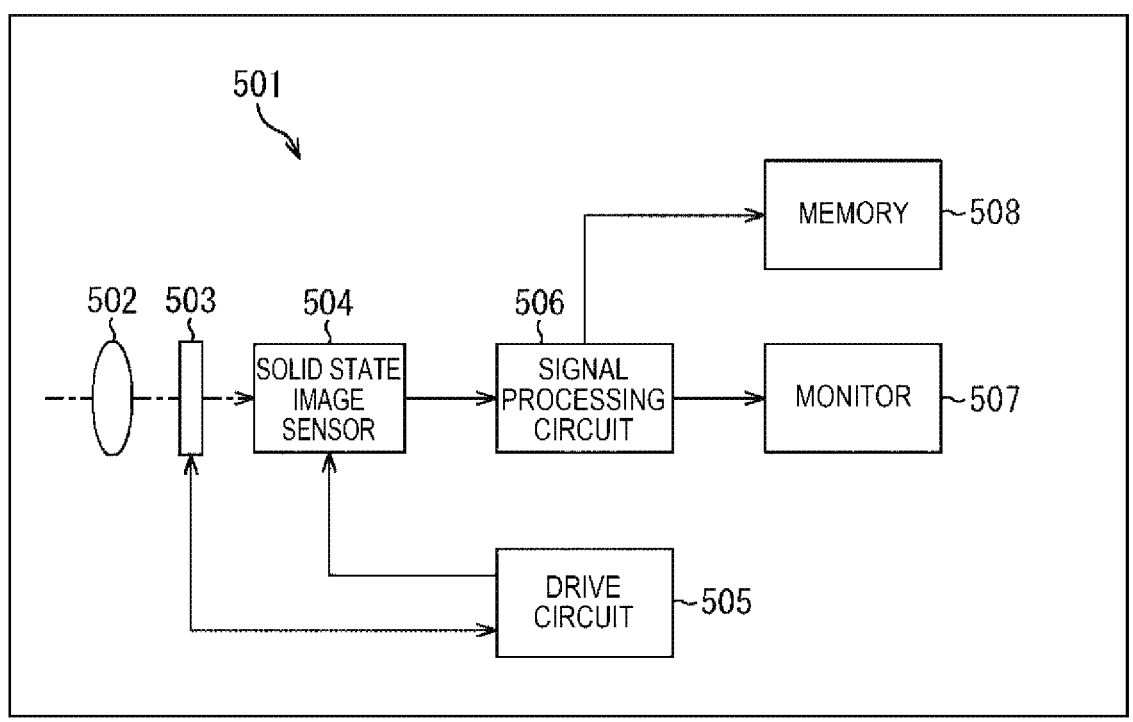

[Fig. 19]
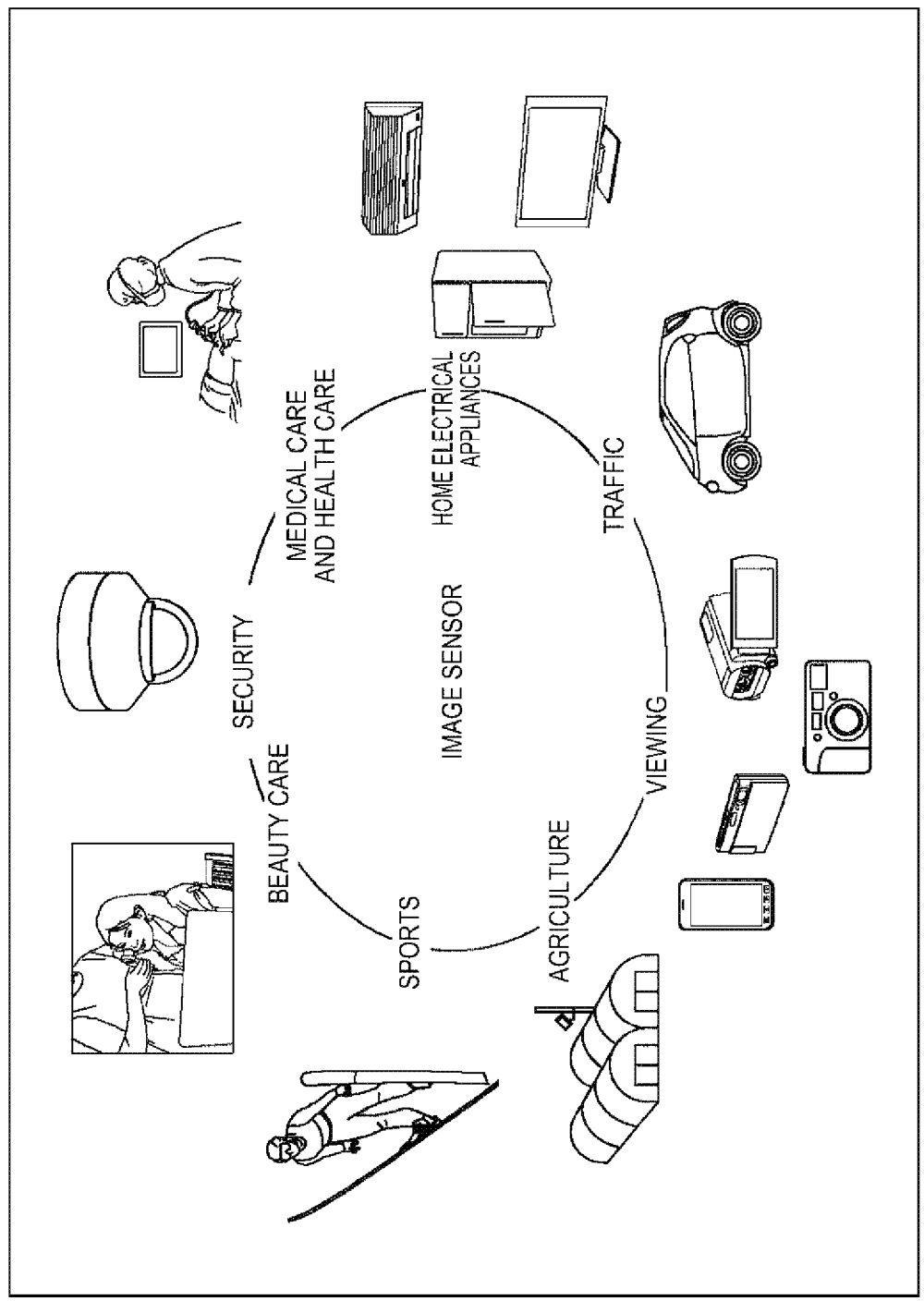

[Fig. 20]
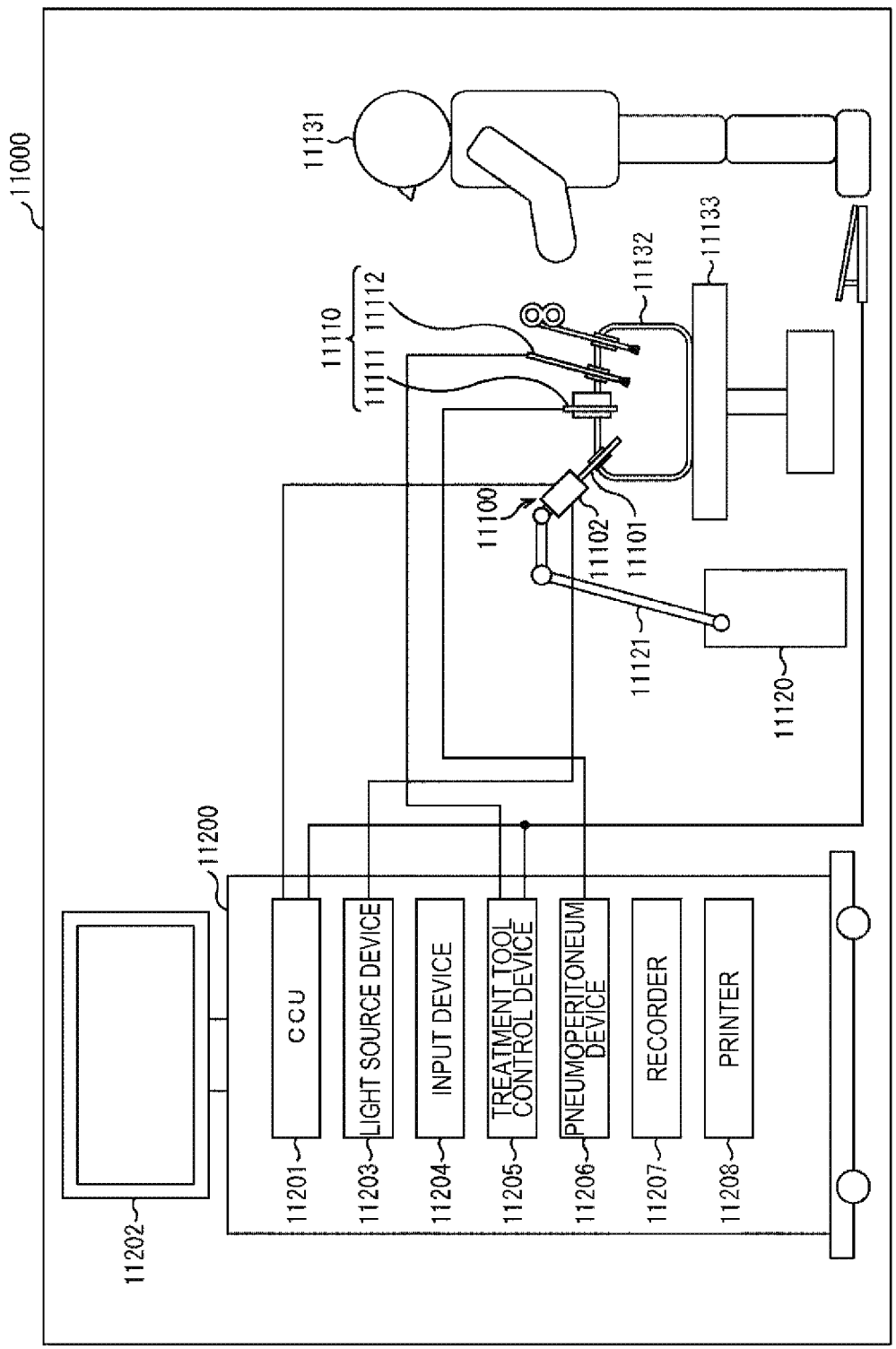

[Fig. 21]
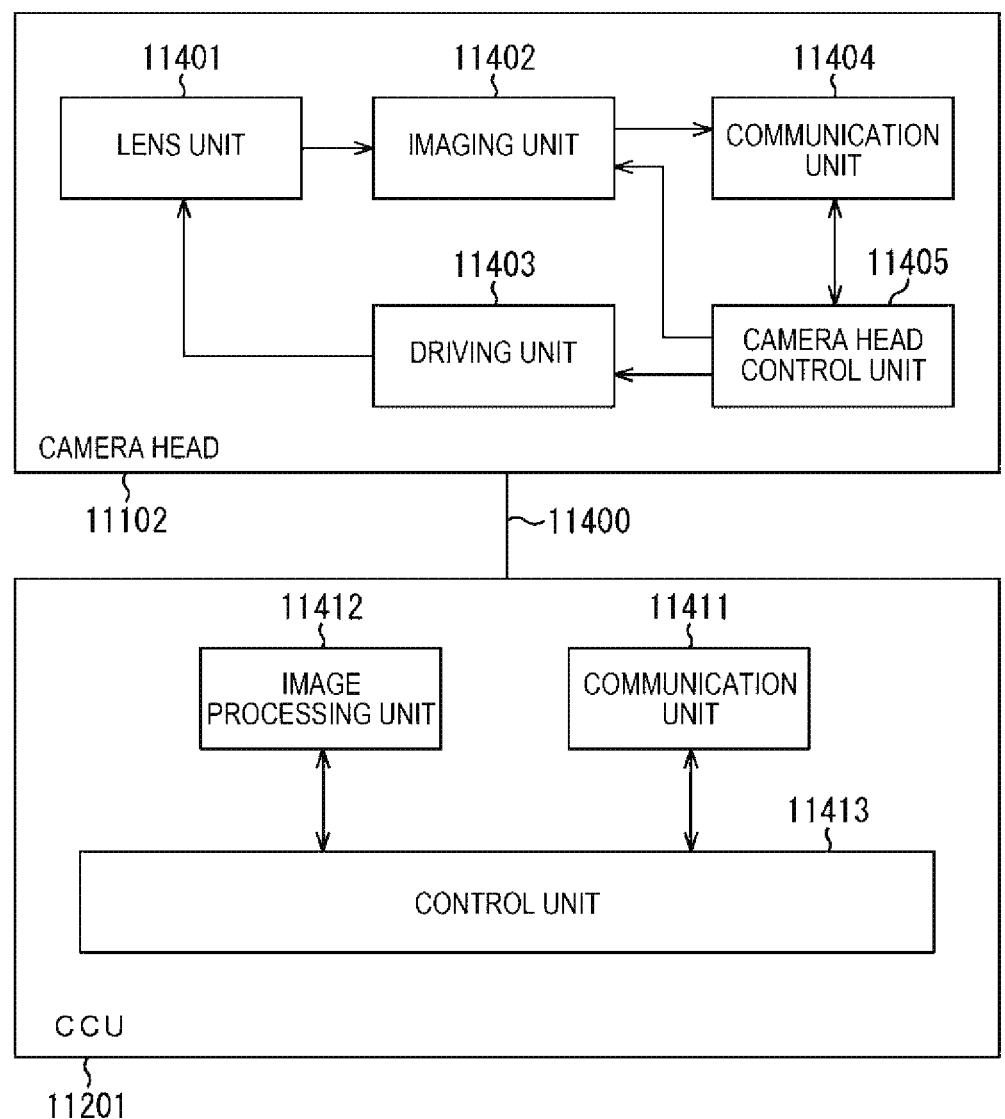

[Fig. 22]
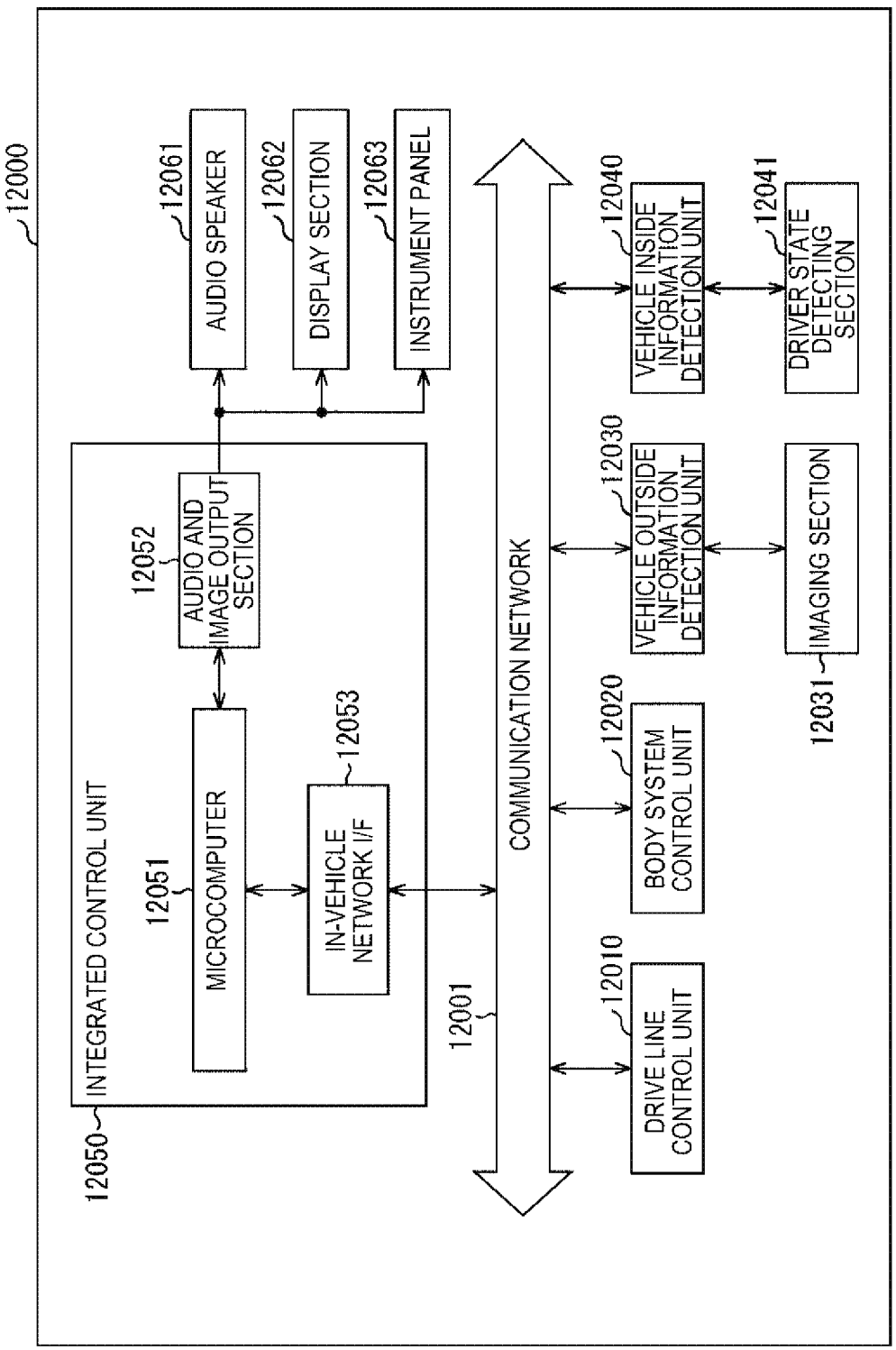

[Fig. 23]
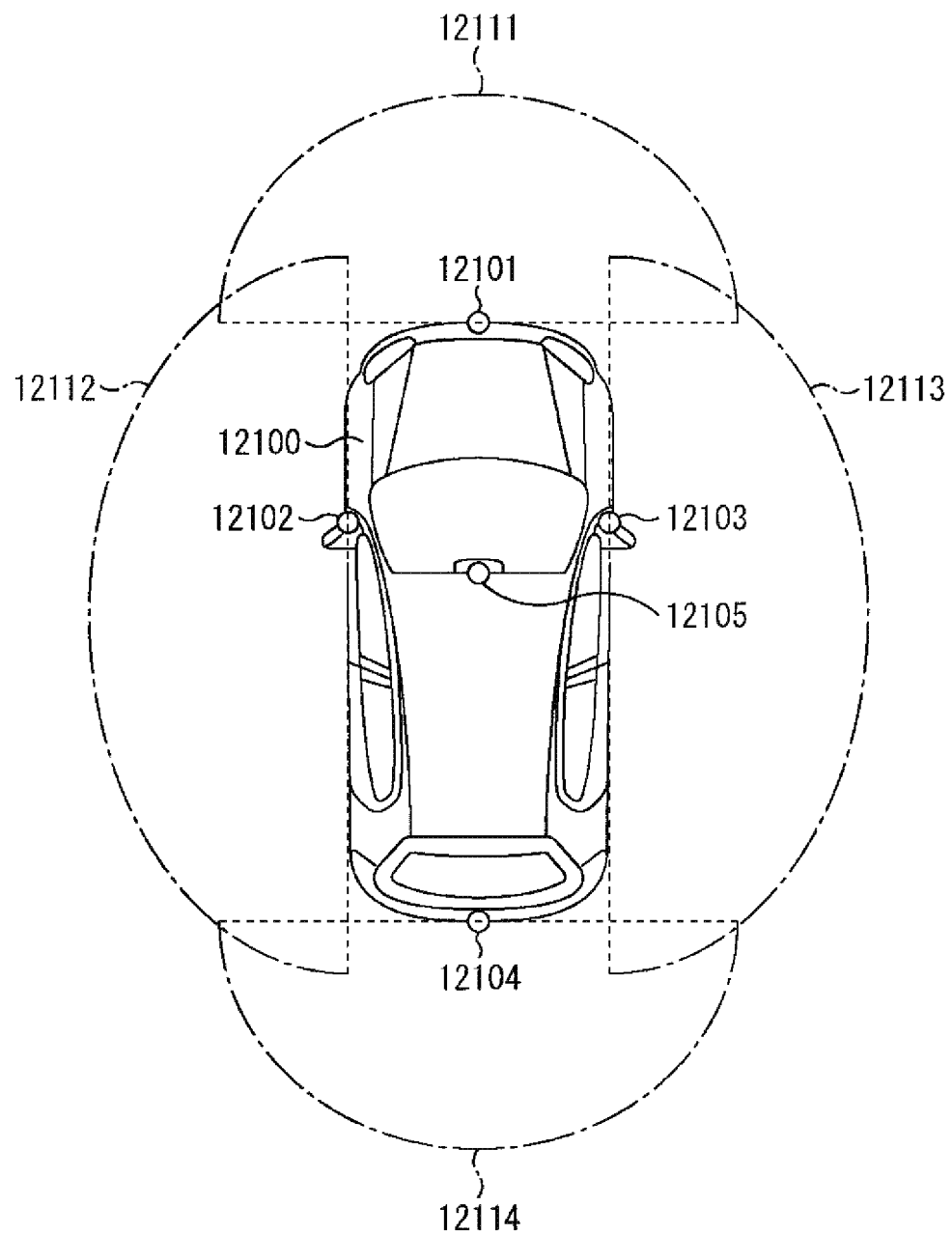

IMAGING APPARATUS AND ELECTRONIC DEVICE

TECHNICAL FIELD

The present disclosure relates to an imaging apparatus and an electronic device, and particularly to an imaging apparatus and an electronic device that achieves size reduction and height reduction of a device configuration and captures an image with reduced occurrence of flare and ghost.

CROSS REFERENCE TO RELATED APPLICATIONS

This is a U.S. National Stage Application under 35 U.S.C. § 371, based on International Application No. PCT/JP2018/018638, filed May 15, 2018, which claims the benefit of Japanese Priority Patent Application JP 2017-105713 filed May 29, 2017, the entire contents of which are incorporated herein by reference.

BACKGROUND ART

In recent years, pixel definition increase, size reduction, and height reduction are promoted in a solid state image sensor used in a digital still camera, a moving object terminal device with camera, or the like.

As the camera increases its pixel definition and reduces its size, a lens and a solid state image sensor generally get closer to each other on an optical axis, and an infrared cut filter is located near the lens.

There is proposed a technology that achieves size reduction of a solid state image sensor by arranging, on the solid state image sensor, the lens of the lowest layer, among a lens group composed of a plurality of lenses, for example.

CITATION LIST

Patent Literature

PTL 1: JP 2015-061193A

SUMMARY OF INVENTION

Technical Problem

However, the lens of the lowest layer arranged on the solid state image sensor contributes to the size reduction and the height reduction of the device configuration, but the distance between the infrared cut filter and the lens becomes smaller, and thereby a ghost and a flare occur due to internal diffuse reflection by light reflection.

The present disclosure is made in view of the above situation, and particularly achieves the size reduction and the height reduction in the solid state image sensor and prevents the occurrence of the flare and the ghost.

Solution to Problem

A camera module having an imaging apparatus, the imaging apparatus comprising: a circuit substrate; an image sensor mounted with the circuit substrate in an integrated assembly; a glass substrate mounted with the image sensor in the integrated assembly; an attenuating infrared optical element covering the image sensor and mounted with the image sensor in the integrated assembly; and an adhesive layer directly bonding the glass substrate or the attenuating infrared optical element to the image sensor.

An imaging device comprising: a glass substrate; an image sensor mounted with the glass substrate in an integrated assembly; an attenuating infrared optical element covering the image sensor and mounted with the image sensor in the integrated assembly; and an adhesive layer bonding the glass substrate or the attenuating infrared optical element to the image sensor.

An electronic apparatus comprising: a circuit substrate; an image sensor mounted with the circuit substrate in an integrated assembly; a glass substrate mounted with the image sensor in the integrated assembly; an attenuating infrared optical element covering the image sensor and mounted with the image sensor in the integrated assembly; a signal processing circuit arranged to receive signals from the image sensor; memory arranged to store image data; a monitor arranged to display image data; and a drive circuit configured to control transfer of signal electric charges in the image sensor.

Advantageous Effects of Invention

One aspect of the present disclosure particularly achieves the size reduction and the height reduction of the device configuration and prevents the occurrence of the flare and the ghost, in the solid state image sensor.

BRIEF DESCRIPTION OF DRAWINGS

FIG. 1 is a diagram for describing a configuration example of a first embodiment of an imaging apparatus of the present disclosure.

FIG. 2 is a diagram for describing that a ghost and a flare do not occur due to internal diffuse reflection, in an imaging apparatus of FIG. 1.

FIG. 3 is a diagram for describing that a ghost and a flare do not occur in an image captured by an imaging apparatus of FIG. 1 due to internal diffuse reflection.

FIG. 4 is a diagram for describing a configuration example of a second embodiment of an imaging apparatus of the present disclosure.

FIG. 5 is a diagram for describing that a ghost and a flare do not occur due to an internal diffuse reflection, in an imaging apparatus of FIG. 4.

FIG. 6 is a diagram for describing a configuration example of a third embodiment of an imaging apparatus of the present disclosure.

FIG. 7 is a diagram for describing a configuration example of a fourth embodiment of an imaging apparatus of the present disclosure.

FIG. 8 is a diagram for describing a configuration example of a fifth embodiment of an imaging apparatus of the present disclosure.

FIG. 9 is a diagram for describing a configuration example of a sixth embodiment of an imaging apparatus of the present disclosure.

FIG. 10 is a diagram for describing a configuration example of a seventh embodiment of an imaging apparatus of the present disclosure.

FIG. 11 is a diagram for describing a configuration example of an eighth embodiment of an imaging apparatus of the present disclosure.

FIG. 12 is a diagram for describing a configuration example of a ninth embodiment of an imaging apparatus of the present disclosure.

FIG. 13 is a diagram for describing a configuration example of a tenth embodiment of an imaging apparatus of the present disclosure.

FIG. 14 is a diagram for describing a configuration example of an eleventh embodiment of an imaging apparatus of the present disclosure.

FIG. 15 is a diagram for describing a configuration example of a twelfth embodiment of an imaging apparatus of the present disclosure.

FIG. 16 is a diagram for describing a configuration example of a thirteenth embodiment of an imaging apparatus of the present disclosure.

FIG. 17 is a diagram for describing a configuration example of a fourteenth embodiment of an imaging apparatus of the present disclosure.

FIG. 18 is a block diagram illustrating a configuration example of an imaging apparatus as an electronic device that employs a camera module of an embodiment of the present disclosure.

FIG. 19 is a diagram for describing a use example of a camera module that employs a technology of the present disclosure.

FIG. 20 is a diagram illustrating an example of a schematic configuration of an endoscopic surgical operation system.

FIG. 21 is a block diagram illustrating an example of a functional configuration of a camera head and a CCU.

FIG. 22 is a block diagram illustrating an example of a schematic configuration of a vehicle control system.

FIG. 23 is an explanatory diagram illustrating an example of installation positions of a vehicle outside information detecting section and the imaging section.

DESCRIPTION OF EMBODIMENTS

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

In the following, a mode (hereinafter, referred to as the embodiment) for performing the present disclosure will be described. Note that description will be made in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Thirteenth Embodiment
14. Fourteenth Embodiment
15. Application to Electronic Device
16. Use Example of Solid State Imaging Apparatus
17. Application Example to Endoscopic Surgical Operation System
18. Application Example to Moving Object

1. First Embodiment

With reference to FIG. 1, a configuration example of an imaging apparatus of a first embodiment of the present disclosure which achieves size reduction and height reduction of a device configuration and prevents occurrence of a ghost and a flare will be described. Note that FIG. 1 is the side cross-sectional view of the imaging apparatus.

The imaging apparatus 1 of FIG. 1 includes a solid state image sensor 11, a glass substrate 12, an infrared cut filter (IRCF) 14, a lens group 16, a circuit substrate 17, an actuator 18, a connector 19, and a spacer 20.

The solid state image sensor 11 is an image sensor made of what is called a complementary metal oxide semiconductor (CMOS) and a charge coupled device (CCD) or the like, and is fixed in an electrically connected state on the circuit substrate 17. The solid state image sensor 11 is composed of a plurality of pixels (not depicted) arranged like an array, and each pixel generates a pixel signal corresponding to the light amount of an incoming light, which is collected and enters via the lens group 16 from above in the drawing, and outputs the pixel signal as an image signal to the outside from the connector 19 via the circuit substrate 17.

The glass substrate 12 is provided on an upper surface portion of the solid state image sensor 11 in FIG. 1, and is bonded to the solid state image sensor 11 by a transparent bonding adhesive (glue) 13 having a substantially same refractive index as the glass substrate 12.

The IRCF 14 that cuts an infrared light among incoming lights is provided on an upper surface portion of the glass substrate 12 in FIG. 1, and is bonded to the glass substrate 12 by a transparent bonding adhesive (glue) 15 having a substantially same refractive index as the glass substrate 12. The IRCF 14 is made of a soda lime glass for example, and cuts the infrared light.

That is, the solid state image sensor 11, the glass substrate 12, and the IRCF 14 are stacked and are bonded together by the transparent bonding adhesives 13, 15 to form an integral configuration, and are connected to the circuit substrate 17.

Also, in the production process of the solid state image sensor 11, the IRCF 14 may be divided into individual dies and thereafter attached to the glass substrate 12, and a large-sized IRCF 14 may be attached to the entire wafer glass substrate 12 composed of a plurality of solid state image sensors 11 and thereafter be divided into individual dies for each solid state image sensor 11, and either method may be employed.

The spacer 20 is arranged on the circuit substrate 17 to surround all of the solid state image sensor 11, the glass substrate 12, and the IRCF 14 integrally configured. Also, the actuator 18 is provided on the spacer 20. The actuator 18 is formed in a cylinder shape, and contains the lens group 16 including a plurality of lenses stacked inside the cylinder, and drives the lens group 16 in the vertical direction in FIG. 1.

With this configuration, the actuator 18 achieves autofocus by adjusting the focal point to form an image of an imaging object on the imaging surface of the solid state image sensor 11, in accordance with the distance to the imaging object (not depicted) located above in the drawing, by moving the lens group 16 in the vertical direction (the front-back direction to the optical axis) in FIG. 1.

With the configuration of the imaging apparatus 1 as in FIG. 1, the IRCF 14 is provided on the solid state image sensor 11 and the glass substrate 12, and therefore the occurrence of the flare and the ghost due to the internal diffuse reflection of the light is prevented.

That is, as illustrated in the left part of FIG. 2, when the IRCF 14 is separated from the glass substrate (glass) 12 and is arranged around a midpoint between the lens (Lens) 16 and the glass substrate 12, the incoming light is collected as illustrated with solid lines, and is incident at a position F0 in the solid state image sensor (CIS) 11 via the IRCF 14, the glass substrate 12, and the bonding adhesive 13, and thereafter reflects at the position F0 as illustrated with dotted lines, generating a reflected light.

For example, as illustrated with the dotted lines, a part of the reflected light reflected at the position F0 reflects at the back surface (the lower surface in FIG. 2) R1 of the IRCF 14 located at a position separated from the glass substrate 12, via the bonding adhesive 13 and the glass substrate 12, and again is incident on the solid state image sensor 11 at a position F1 via the glass substrate 12 and the bonding adhesive 13.

Also, for example, as illustrated with the dotted lines, another part of the reflected light reflected at the focal point F0 transmits through the bonding adhesive 13, the glass substrate 12, and the IRCF 14 located at the position separated from the glass substrate 12, and reflects at the upper surface (the upper surface in FIG. 2) R2 of the IRCF 14, and is incident on the solid state image sensor 11 again at a position F2 via the IRCF 14, the glass substrate 12, and the bonding adhesive 13.

At this positions F1, F2, the lights that are incident again generate flare and ghost due to internal diffuse reflection. More specifically, as illustrated with an image P1 of FIG. 3, a flare and a ghost appear as illustrated with reflected lights R21, R22, when a lighting L is captured in the solid state image sensor 11.

In contrast, when the IRCF 14 is configured on the glass substrate 12 as in the imaging apparatus 1 illustrated in the right part of FIG. 2 which corresponds to the configuration of the imaging apparatus 1 of FIG. 1, the incoming light illustrated with the solid lines is collected, and is incident at the position F0 on the solid state image sensor 11, via the IRCF 14, the bonding adhesive 15, the glass substrate 12, and the bonding adhesive 13, and thereafter reflects as illustrated with the dotted lines. Then, the reflected light reflects on a surface R11 of the lens of the lowest layer in the lens group 16, via the bonding adhesive 13, the glass substrate 12, the bonding adhesive 15, and the IRCF 14, but the lens group 16 is the position sufficiently away from the IRCF 14, and therefore the light is reflected to an area that does not receive the light sufficiently in the solid state image sensor 11.

That is, the solid state image sensor 11, the glass substrate 12, and the IRCF 14 are formed into a configuration bonded together and integrated by the bonding adhesives 13, 15 of the substantially same refractive index, and therefore the integrated configuration unit U surrounded by an alternate long and short dash line of in the drawing has a unified refractive index, thereby preventing occurrence of internal diffuse reflection that occurs at a boundary between layers having different refractive indexes, and preventing re-incidence at the positions F1, F2 in the vicinity of the position F0 in the left part of FIG. 2, for example.

Thereby, when capturing an image of the lighting L, the imaging apparatus 1 of FIG. 1 can capture an image in which the occurrence of the flare and the ghost, like the reflected lights R21, R22 in the image P1, due to the internal diffuse reflection is prevented as illustrated with the image P2 of FIG. 3.

As a result, the size reduction and the height reduction of the device configuration are achieved by the configuration like the imaging apparatus 1 of the first embodiment illustrated in FIG. 1, and the occurrence of the flare and the ghost due to the internal diffuse reflection is prevented.

Note that the image P1 of FIG. 3 is an image that captures the lighting L in the night by the imaging apparatus 1 including the configuration of the left part of FIG. 2, and the image P2 is an image that captures the lighting L in the night by the imaging apparatus 1 (of FIG. 1) including the configuration of the right part of FIG. 2.

Also, in the above, an example has been described in which the configuration achieves autofocus by adjusting the focal length in accordance with the distance to the imaging object by moving the lens group 16 in the vertical direction in FIG. 1 by the actuator 18, but may be functioned as what is called a single focus lens, without providing the actuator 18, and without adjusting the focal length of the lens group 16.

2. Second Embodiment

Although in the first embodiment an example has been described in which the IRCF 14 is attached on the glass substrate 12 attached to the imaging surface side of the solid state image sensor 11, the lens of the lowest layer that configures the lens group 16 may be provided on the IRCF 14.

FIG. 4 illustrates a configuration example of the imaging apparatus 1 in which the lens of the lowest layer in the light incidence direction is arranged on the IRCF 14 and separated from the lens group 16, among the lens group 16 composed of a plurality of lenses that configure the imaging apparatus 1 in FIG. 1. Note that, in FIG. 4, a component that has the basically same function as the component in FIG. 1 is denoted with the same reference sign, and its description is omitted as appropriate.

That is, the imaging apparatus 1 of FIG. 4 differs from the imaging apparatus 1 of FIG. 1 in that the lens 31 of the lowest layer in the light incidence direction is separated from the lens group 16, among a plurality of lenses that configure the lens group 16, on the upper surface of the IRCF 14 in the drawing. Note that the lens group 16 of FIG. 4 is denoted with the same reference sign as the lens group 16 of FIG. 1, but differs from the lens group 16 of FIG. 1 in the strict meaning, in that the lens 31 of the lowest layer in the light incidence direction is not included.

With the configuration of the imaging apparatus 1 as in FIG. 4, the IRCF 14 is provided on the glass substrate 12 provided on the solid state image sensor 11, and the lens 31 of the lowest layer that configures the lens group 16 is provided on the IRCF 14, and therefore the occurrence of the flare and the ghost due to the internal diffuse reflection of the light is prevented.

That is, as illustrated in the left part of FIG. 5, when the lens 31 of the lowest layer in the light incidence direction of the lens group 16 is provided on the glass substrate 12, and the IRCF 14 is separated from the lens 31 and is arranged around the midpoint between the lens group 16 and the lens 31, the incoming light illustrated with the solid lines is collected and is incident at the position F0 on the solid state image sensor 11 via the IRCF 14, the lens 31, the glass substrate 12, and the bonding adhesive 13, and thereafter reflects from the position F0 as illustrated with the dotted lines, and generates the reflected light.

For example, as illustrated with the dotted lines, a part of the reflected light reflected at the position F0 reflects on the back surface (the lower surface in FIG. 2) R31 of the IRCF 14 located at a position separated from the lens 31 via the bonding adhesive 13, the glass substrate 12, and the lens 31, and is incident on the solid state image sensor 11 again at the position F11 via the lens 31, the glass substrate 12, and the bonding adhesive 13.

Also, for example, as illustrated with the dotted lines, another part of the reflected light reflected at the focal point F0 transmits through the bonding adhesive 13, the glass substrate 12, the lens 31, and the IRCF 14 located at the position separated from the lens 31, and reflects on the upper surface (the upper surface in FIG. 2) R32 of the IRCF 14, and is incident on the solid state image sensor 11 again at the position F12 via the IRCF 14, the lens 31, the glass substrate 12, and the bonding adhesive 13.

At these positions F11, F12, the light that is incident again appears as a flare and a ghost, in the solid state image sensor 11. This point is basically similar to the principle described with reference to FIG. 3 and generated when the reflected lights R21, R21 of the lighting L in the image P1 are again incident at the positions F1, F2 of FIG. 2.

In contrast, when the lens 31 of the lowest layer of the lens group 16 is arranged on the IRCF 14 as illustrated in the right part of FIG. 5, similarly to the configuration in the imaging apparatus 1 of FIG. 4, the incoming light is collected as illustrated with the solid lines, and is incident at the position F0 on the solid state image sensor 11 via the lens 31, the IRCF 14, the bonding adhesive 15, the glass substrate 12, and the bonding adhesive 13, and thereafter reflects, so that the reflected light is generated by the surface R41 on the lens group 16 at a position sufficiently away via the bonding adhesive 13, the glass substrate 12, the bonding adhesive 15, the IRCF 14, and the lens 31 as illustrated with the dotted lines, but reflects to an area where the solid state image sensor 11 does not receive the light practically, thereby reducing the occurrence of the flare and the ghost.

That is, the solid state image sensor 11, the bonding adhesive 13, the glass substrate 12, and the IRCF 14 have an integrated configuration bonded together by the bonding adhesives 13, 15 of the substantially same refractive index, and therefore the integrated configuration unit U surrounded by the alternate long and short dash line in the drawing has a unified refractive index, thereby preventing the occurrence of the internal diffuse reflection that occurs at the boundary between the layers of the different refractive indexes, and preventing the incidence of the reflected light at the positions F11, F12 in the vicinity of the of the position F0 as illustrated in the left part of FIG. 5, for example.

As a result, with the configuration like the imaging apparatus 1 of the second embodiment illustrated in FIG. 5, the size reduction and the height reduction of the device configuration are achieved, and the occurrence of the flare and the ghost due to the internal diffuse reflection is prevented.

3. Third Embodiment

Although in the second embodiment an example in which the lens 31 of the lowest layer is provided on the IRCF 14 has been described, the lens 31 of the lowest layer and the IRCF 14 may be bonded together by the bonding adhesive.

FIG. 6 illustrates a configuration example of the imaging apparatus 1 in which the lens 31 of the lowest layer and the IRCF 14 are bonded together by the bonding adhesive. Note that, in the imaging apparatus 1 of FIG. 6, the component that has the same function as the component of the imaging apparatus 1 of FIG. 4 is denoted with the same reference sign, and its description is omitted as appropriate.

That is, the imaging apparatus 1 of FIG. 6 differs from the imaging apparatus 1 of FIG. 4 in that the lens 31 of the lowest layer and the IRCF 14 are bonded together by a transparent bonding adhesive 51, i.e., a bonding adhesive 51 having a substantially same refractive index.

The configuration like the imaging apparatus 1 of FIG. 6 also prevents the occurrence of the flare and the ghost, similarly to the imaging apparatus 1 of FIG. 4.

Also, when the flatness of the lens 31 is not great, there is a risk that the IRCF 14 is misaligned to the optical axis of the lens 31 even if the lens 31 is fixed to the IRCF 14 without using the bonding adhesive 51, but the lens 31 and the IRCF 14 are bonded together by the bonding adhesive 51, and thereby the IRCF 14 is fixed without the misalignment to the optical axis of the lens 31 even if the flatness of the lens 31 is not great, thereby preventing occurrence of distortion of the image that occurs due to the misalignment of the optical axis.

4. Fourth Embodiment

Although in the second embodiment an example in which the lens 31 of the lowest layer in the light incidence direction is provided on the IRCF 14 has been described, not only the lens 31 of the lowest layer but also a group of lenses that configures the lowest layer of the lens group 16 may be provided on the IRCF 14.

FIG. 7 illustrates a configuration example of the imaging apparatus 1 in which the lens group composed of a plurality of lenses that configure the lowest layer in the incidence direction, among the lens group 16, is arranged on the IRCF 14. Note that, in the imaging apparatus 1 of FIG. 7, the component that has the same function as the component of the imaging apparatus 1 of FIG. 4 is denoted with the same reference sign, and its description will be omitted as appropriate.

That is, the imaging apparatus 1 of FIG. 7 differs from the imaging apparatus 1 of FIG. 4 in that a lens group 71 composed of a plurality of lenses that configure the lowest layer in the light incidence direction among the lens group 16 is provided on the IRCF 14, instead of the lens 31. Although FIG. 7 illustrates an example of the lens group 71 composed of two lenses, the lens group 71 may be composed of a larger number of lenses.

With this configuration as well, the occurrence of the flare and the ghost is prevented, similarly to the imaging apparatus 1 of FIG. 4.

Also, the lens group 71 composed of a plurality of lenses that configure the lowest layer among a plurality of lenses that configure the lens group 16 is arranged on the IRCF 14, and thus the number of lenses that configure the lens group 16 is reduced, and the weight of the lens group 16 is reduced, and therefore the driving force amount of the actuator 18 used in the autofocus is reduced, and the size reduction and the electric power reduction of the actuator 18 are achieved.

Note that the lens 31 in the imaging apparatus 1 of FIG. 6 of the third embodiment may be attached to the IRCF 14 with the transparent bonding adhesive 51, instead of the lens group 71.

5. Fifth Embodiment

Although in the second embodiment an example has been described in which the glass substrate 12 is attached on the solid state image sensor 11 by the bonding adhesive 13, and the IRCF 14 is attached on the glass substrate 12 by the bonding adhesive 15, the glass substrate 12, the bonding adhesive 15, and the IRCF 14 may be replaced by a component that has both of the function of the glass substrate 12 and the function of the IRCF 14, so that the component is attach on the solid state image sensor 11 by the bonding adhesive 13.

FIG. 8 illustrates a configuration example of the imaging apparatus 1 in which the glass substrate 12, the bonding adhesive 15, and the IRCF 14 are replaced by a component that has both of the function of the glass substrate 12 and the function of the IRCF 14, and the component is attached on the solid state image sensor 11 by the bonding adhesive 13, and the lens 31 of the lowest layer is provided thereon. Note that, in the imaging apparatus 1 of FIG. 8, the component that has the same function as the component of the imaging apparatus 1 of FIG. 4 is denoted with the same reference sign, and its description will be omitted as appropriate.

That is, the imaging apparatus 1 of FIG. 8 differs from the imaging apparatus 1 of FIG. 4 in that the glass substrate 12 and the IRCF 14 are replaced by an IRCF glass substrate 14' that has the function of the glass substrate 12 and the function of the IRCF 14, and the IRCF glass substrate 14' is attached on the solid state image sensor 11 by the bonding adhesive 13, and, the lens 31 of the lowest layer is provided on the IRCF 14'.

With this configuration as well, the occurrence of the flare and the ghost is prevented, similarly to the imaging apparatus 1 of FIG. 4.

That is, currently, for the purpose of the size reduction, the solid state image sensor 11 can achieve a small solid state image sensor, by bonding the glass substrate 12 and the solid state image sensor 11 and thinning the solid state image sensor 11 with the glass substrate as a base substrate, which is referred to as a chip size package (CSP) structure. In FIG. 8, the IRCF glass substrate 14' has the function of the IRCF 14, as well as the function of the flat glass substrate 12, thereby achieving the height reduction.

Note that the glass substrate 12, the bonding adhesive 15, and the IRCF 14 in the imaging apparatus 1 of FIG. 1, FIG. 6, and FIG. 7, which are the first embodiment, the third embodiment, and the fourth embodiment may be replaced by the IRCF glass substrate 14' that has the function of the glass substrate 12 and the function of the IRCF 14.

6. Sixth Embodiment

Although in the fourth embodiment an example has been described in which the glass substrate 12 is attached on the solid state image sensor 11 of the CSP structure by the bonding adhesive 13, and the IRCF 14 is attached on the glass substrate 12 by the bonding adhesive 15, and the lens group 71 composed of a plurality of lenses of the lowest layer, among a plurality of lenses that configure the lens group 16, is provided on the IRCF 14, the solid state image sensor 11 of a chip on board (COB) structure may be used, instead of the solid state image sensor 11 of the CSP structure.

FIG. 9 illustrates a configuration example in which the glass substrate 12 and the IRCF 14 in the imaging apparatus 1 of FIG. 7 are replaced by the IRCF glass substrate 14' that has the function of the glass substrate 12 and the function of the IRCF 14, and the solid state image sensor 11 of the chip on board (COB) structure is used instead of the solid state image sensor 11 of the CSP structure. Note that, in the imaging apparatus 1 of FIG. 9, the component that has the same function as the component of the imaging apparatus 1 of FIG. 7 is denoted with the same reference sign, and its description will be omitted as appropriate.

That is, the imaging apparatus 1 of FIG. 9 differs from the imaging apparatus 1 of FIG. 7 in that the glass substrate 12 and the IRCF 14 are replaced by the IRCF glass substrate 14' that has the function of the glass substrate 12 and the function of the IRCF 14, and in that a solid state image sensor 91 of chip on board (COB) structure is used instead of the solid state image sensor 11 of the CSP structure.

With this configuration as well, the occurrence of the flare and the ghost is prevented, similarly to the imaging apparatus 1 of FIG. 7.

Moreover, although in recent years the CSP structure is widespread for the purpose of the size reduction of the imaging apparatus 1 and the size reduction of the solid state image sensor 11, the production of the CSP structure is complicated, because of lamination with the glass substrate 12 or the IRCF glass substrate 14', wiring the terminal of the solid state image sensor 11 in the back side of the light receiving surface, etc., and thus is more expensive than the solid state image sensor 11 of the COB structure. Thus, not only the CSP structure, but the solid state image sensor 91 of the COB structure connected to the circuit substrate 17 by a wire bond 92 or the like may be used.

The connection to the circuit substrate 17 is made easy, by using the solid state image sensor 91 of the COB structure, and therefore the production is made simple, and the cost is reduced.

Note that the solid state image sensor 11 of the CSP structure in the imaging apparatus 1 of FIG. 1, FIG. 4, FIG. 6, and FIG. 8 which are the first embodiment to the third embodiment and the fifth embodiment may be replaced by the solid state image sensor 11 of chip on board (COB) structure.

7. Seventh Embodiment

Although in the second embodiment an example has been described in which the glass substrate 12 is provided on the solid state image sensor 11, and the IRCF 14 is provided on the glass substrate, the IRCF 14 may be provided on the solid state image sensor 11, and the glass substrate 12 may be provided on the IRCF 14.

FIG. 10 illustrates a configuration example of the imaging apparatus 1 in which the IRCF 14 is provided on the solid state image sensor 11, and the glass substrate 12 is provided on the IRCF 14, when the glass substrate 12 is used.

The imaging apparatus 1 of FIG. 10 differs from the imaging apparatus 1 of FIG. 4 in that the glass substrate 12 and the IRCF 14 switch their positions, and the IRCF 14 is attached on the solid state image sensor 11 by the transparent bonding adhesive 13, and the glass substrate 12 is attached on the IRCF 14 by the transparent bonding adhesive 15, so that the lens 31 is provided on the glass substrate 12.

With this configuration as well, the occurrence of the flare and the ghost is prevented, similarly to the imaging apparatus 1 of FIG. 4.

Also, the IRCF 14 generally has the characteristics of non-flatness due to temperature and external disturbance, and it is possible that the distortion occurs in the image on the solid state image sensor 11.

Thus, in general, a coating material or the like is applied on both surfaces of the IRCF 14, and a special material is employed to maintain the flatness, but this results in cost increase.

In contrast, in the imaging apparatus 1 of FIG. 10, the non-flat IRCF 14 is sandwiched by the flat solid state image sensor 11 and the glass substrate 12, and thereby the flatness is maintained with low cost, and the distortion of the image is reduced.

Thus, the imaging apparatus 1 of FIG. 10 reduces the occurrence of the flare and the ghost, and reduces the distortion of the image that occurs due to the characteristics of the IRCF 14. Also, the coating made of the special material for maintaining the flatness becomes unnecessary, and thus the cost is reduced.

Note that, also in the imaging apparatus 1 of FIG. 1, FIG. 6, and FIG. 7 which is the first embodiment, the third embodiment, and the fourth embodiment, the glass substrate 12 and the IRCF 14 may switch their positions and be attached by the bonding adhesives 13, 15.

8. Eighth Embodiment

Although in the first embodiment an example has been described in which the IRCF 14 is used as the component for cutting the infrared light, any component capable of cutting the infrared light, other than the IRCF 14, may be used, and for example an infrared light cut resin may be applied and used, instead of the IRCF 14.

FIG. 11 is a configuration example of the imaging apparatus 1 in which the infrared light cut resin is used instead of the IRCF 14. Note that, in the imaging apparatus 1 of FIG. 11, the component that has the same function as the imaging apparatus 1 of FIG. 1 is denoted with the same reference sign, and its description will be omitted as appropriate.

That is, the imaging apparatus 1 of FIG. 11 differs from the imaging apparatus 1 of FIG. 1 in that an infrared light cut resin 111 is provided instead of the IRCF 14. The infrared light cut resin 111 is applied and provided, for example.

With this configuration as well, the occurrence of the flare and the ghost is prevented, similarly to the imaging apparatus 1 of FIG. 1.

Also, in recent years, the resin is improved, and the resin with infrared cut effect is widespread, and it is known that the infrared light cut resin 111 can be applied to the glass substrate 12 at the time of the production of the CSP solid state image sensor 11.

Note that the infrared light cut resin 111 may be used, instead of the IRCF 14 in the imaging apparatus 1 of FIG. 4, FIG. 6, FIG. 7, and FIG. 10, which are the second embodiment to the fourth embodiment, and the seventh embodiment.

9. Ninth Embodiment

Although in the second embodiment an example has been described in which, when the glass substrate 12 is used, the flat plate glass substrate 12 is provided and closely attached to the solid state image sensor 11 without a hollow space or the like, a hollow space (cavity) may be provided between the glass substrate 12 and the solid state image sensor 11.

FIG. 12 illustrates a configuration example of the imaging apparatus 1 in which a hollow space (cavity) is provided between the glass substrate 12 and the solid state image sensor 11. In the imaging apparatus 1 of FIG. 12, the component that has the same function as the component of the imaging apparatus 1 of FIG. 4 is denoted with the same reference sign, and its description will be omitted as appropriate.

That is, the imaging apparatus 1 of FIG. 12 differs from the imaging apparatus of FIG. 4 in that a glass substrate 131 that has protruding portions 131a at the circumference is provided, instead of the glass substrate 12. The protruding portions 131a of the circumference are in contact with the solid state image sensor 11, and the protruding portions 131a are bonded by a transparent bonding adhesive 132, and thereby a hollow space (cavity) 131b of an air layer is formed between the imaging surface of the solid state image sensor 11 and the glass substrate 131.

With this configuration as well, the occurrence of the flare and the ghost is prevented, similarly to the imaging apparatus 1 of FIG. 4.

Note that the hollow space (cavity) 131b may be formed, by bonding only the protruding portions 131a by the bonding adhesive 132, by using the glass substrate 131, instead of the glass substrate 12 in the imaging apparatus 1 of FIG. 1, FIG. 6, FIG. 7, and FIG. 11, which are the first embodiment, the third embodiment, the fourth embodiment, and the eighth embodiment.

10. Tenth Embodiment

Although in the second embodiment an example has been described in which the lens 31 of the lowest layer of the lens group 16 is arranged on the IRCF 14 provided on the glass substrate 12, the IRCF 14 on the glass substrate 12 may be replaced by a coating material of an organic multilayer film that has an infrared light cut function.

FIG. 13 illustrates a configuration example of the imaging apparatus 1 in which the IRCF 14 on the glass substrate 12 is replaced by a coating material of an organic multilayer film that has an infrared light cut function.

The imaging apparatus 1 of FIG. 13 differs from the imaging apparatus 1 of FIG. 4 in that the IRCF 14 on the glass substrate 12 is replaced by a coating material 151 of an organic multilayer film that has an infrared light cut function.

With this configuration as well, the occurrence of the flare and the ghost is prevented, similarly to the imaging apparatus 1 of FIG. 4.

Note that the coating material 151 of the organic multilayer film that has the infrared light cut function may be used, instead of the IRCF 14 in the imaging apparatus 1 of FIG. 1, FIG. 6, FIG. 7, FIG. 10, and FIG. 12, which are the first embodiment, the third embodiment, the fourth embodiment, the seventh embodiment, and the ninth embodiment.

11. Eleventh Embodiment

Although in the tenth embodiment an example has been described in which the lens 31 of the lowest layer of the lens group 16 is provided on the coating material 151 of the organic multilayer film that has the infrared light cut function, instead of the IRCF 14 on the glass substrate 12, an anti-reflection (AR) coat may be applied on the lens 31 additionally.

FIG. 14 illustrates a configuration example of the imaging apparatus 1 in which an AR coat is applied on the lens 31 in the imaging apparatus 1 of FIG. 13.

That is, the imaging apparatus 1 of FIG. 14 differs from the imaging apparatus 1 of FIG. 13 in that the lens 171 of the lowest layer of the lens group 16, on which an AR coat 171a is applied, is provided instead of the lens 31. The AR coat 171a can employ vacuum vapor deposition, sputtering, or wet coating, or the like, for example.

With this configuration as well, the occurrence of the flare and the ghost is prevented, similarly to the imaging apparatus 1 of FIG. 4.

Also, the AR coat 171a of the lens 171 reduces the internal diffuse reflection of the reflected light from the solid state image sensor 11, and thus the occurrence of the flare and the ghost is reduced with a higher accuracy.

Note that the lens 171 on which the AR coat 171a is applied may be used, instead of the lens 31 in the imaging apparatus 1 of FIG. 4, FIG. 6, FIG. 8, FIG. 10, FIG. 12, and FIG. 13, which are the second embodiment, the third embodiment, the fifth embodiment, the seventh embodiment, the ninth embodiment, and the tenth embodiment. Also, an AR coat similar to the AR coat 171a may be applied on the surface (the uppermost surface in the drawing) of the lens group 71 in the imaging apparatus 1 of FIG. 7 and FIG. 9, which are the fourth embodiment and the sixth embodiment.

12. Twelfth Embodiment

Although in the eleventh embodiment an example has been described in which the lens 171 on which the anti-reflection (AR) coat 171a is applied is used instead of the lens 31, any component that has a reflection prevention function, other than the AR coat, may be employed, and for example a moth-eye structure, which is a minute irregular structure that prevents the reflection, may be employed.

FIG. 15 illustrates a configuration example of the imaging apparatus 1 provided with a lens 191 to which the reflection prevention function of the moth-eye structure is added, instead of the lens 31 in the imaging apparatus 1 of FIG. 13.

That is, the imaging apparatus 1 of FIG. 15 differs from the imaging apparatus 1 of FIG. 13 in that the lens 191 of the lowest layer of the lens group 16 provided with the reflection prevention processing unit 191a processed to form the moth-eye structure is provided instead of the lens 31.

With this configuration as well, the occurrence of the flare and the ghost is prevented, similarly to the imaging apparatus 1 of FIG. 13.

Also, in the lens 191, the internal diffuse reflection of the reflected light from the solid state image sensor 11 is reduced by the reflection prevention processing unit 191a processed to form the moth-eye structure, and thus the occurrence of the flare and the ghost is reduced with a higher accuracy. Note that the reflection prevention processing unit 191a may undergo a reflection prevention process other than the moth-eye structure, if the reflection prevention processing unit 191a has the reflection prevention function.

Note that the lens 191 provided with the reflection prevention processing unit 191a may be used, instead of the lens 31 in the imaging apparatus 1 of FIG. 4, FIG. 6, FIG. 8, FIG. 10, FIG. 12, and FIG. 13, which are the second embodiment, the third embodiment, the fifth embodiment, the seventh embodiment, the ninth embodiment, and the tenth embodiment. Also, a reflection prevention process similar to the reflection prevention processing unit 191a may be performed on the surface of the lens group 71 in the imaging apparatus 1 of FIG. 7 and FIG. 9, which are the fourth embodiment and the sixth embodiment.

13. Thirteenth Embodiment

Although in the fourth embodiment an example has been described in which the lens 31 of the lowest layer of the lens group 16 is provided on the IRCF 14, they may be replaced by a component that has an infrared light cut function and a function similar to the lens 31 of the lowest layer.

FIG. 16 illustrates a configuration example of the imaging apparatus 1 in which the infrared light cut lens that has the infrared light cut function and the function similar to the lens of the lowest layer of the lens group 16 is provided, instead of the IRCF 14 and the lens 31 of the lowest layer of the lens group 16 in the imaging apparatus 1 of FIG. 4.

That is, the imaging apparatus 1 of FIG. 16 differs from the imaging apparatus 1 of FIG. 4 in that an infrared light cut lens 201 with the infrared light cut function is provided, instead of the IRCF 14 and the lens 31 of the lowest layer of the lens group 16.

With this configuration as well, the occurrence of the flare and the ghost is prevented, similarly to the imaging apparatus 1 of FIG. 4.

Also, the infrared light cut lens 201 is a component that has both of the infrared light cut function and the function as the lens 31 of the lowest layer of the lens group 16, and therefore is needless to provide each of the IRCF 14 and the lens 31 individually, and therefore the size and the height of the device configuration of the imaging apparatus 1 are reduced. Also, the lens group 71 and the IRCF 14 in the imaging apparatus 1 of FIG. 7 which is the fourth embodiment may be replaced by the infrared light cut lens that has both of the infrared light cut function and the function as the lens group 71 composed of a plurality of lenses of the lowest layer of the lens group 16.

14. Fourteenth Embodiment

It is known that a stray light easily enters from a peripheral part of the light receiving surface of the solid state image sensor 11. Thus, the occurrence of the flare and the ghost may be prevented, by preventing intrusion of the stray light, by providing a black mask at the peripheral part of the light receiving surface of the solid state image sensor 11.

The left part of FIG. 17 illustrates a configuration example of the imaging apparatus 1 in which a glass substrate 221 provided with a black mask that blocks the light at the peripheral part of the light receiving surface of the solid state image sensor 11 is provided, instead of the glass substrate 12 in the imaging apparatus 1 of FIG. 13.

That is, the imaging apparatus 1 of the left part of FIG. 17 differs from the imaging apparatus 1 of FIG. 13 in that the glass substrate 221 provided with a black mask 221a made of a shading film at a peripheral part Z2 as illustrated in the right part of FIG. 17 is provided, instead of the glass substrate 12. The black mask 221a is provided on the glass substrate 221 by photolithography or the like. Note that the black mask is not provided at a center part Z1 of the glass substrate 221 in the right part of FIG. 17.

With this configuration as well, the occurrence of the flare and the ghost is prevented, similarly to the imaging apparatus 1 of FIG. 4.

Also, the glass substrate 221 is provided with the black mask 221a at the peripheral part Z2, and thus the intrusion of the stray light from the peripheral part is prevented, and the occurrence of the flare and the ghost due to the stray light is prevented.

Note that the black mask 221a may be provided on another component, not the glass substrate 221, if the component prevents the stray light from entering the solid state image sensor 11, and for example may be provided on the lens 31 and the coating material 151 of the organic multilayer film that has the infrared light cut function, and may be provided on the IRCF 14, the IRCF glass substrate 14', the glass substrate 131, the lenses 71, 171, 191, the infrared light cut resin 111, the infrared light cut lens 201, or the like. Note that, here, if the surface is not flat and the black mask is unable to be provided by the photolithography, the black mask may be provided on the non-flat surface by ink jet, for example.

As above, according to an embodiment of the present disclosure, it is possible to reduce the ghost and the flare due to the light internal diffuse reflection from the solid state image sensor associated with the size reduction, and the pixel definition increase, the image quality improvement, and the size reduction are achieved without reducing the performance of the imaging apparatus. One or more features shown in the above example embodiments may be applied to other example embodiments that do not include the one or more features. Suitable combinations of features other than those shown are also possible.

15. Application Example to Electronic Device

The imaging apparatus 1 of the above FIG. 1, FIG. 4, FIG. 6 to FIG. 17 can be applied to various types of electronic devices, such as an imaging apparatus such as a digital still camera and a digital video camera, a mobile phone that has an imaging function, or another device that has an imaging function, for example.

FIG. 18 is a block diagram illustrating a configuration example of an imaging apparatus as an electronic device that employs the present technology.

An imaging apparatus 501 illustrated in FIG. 18 includes an optical system 502, a shutter device 503, a solid state image sensor 504, a drive circuit 505, a signal processing circuit 506, a monitor 507, and a memory 508, and is capable of capturing a still image and a moving image.

The optical system 502 includes one or a plurality of lenses, and leads a light (incidence light) from an imaging object to the solid state image sensor 504, and forms an image on the light receiving surface of the solid state image sensor 504.

The shutter device 503 is located between the optical system 502 and the solid state image sensor 504, and controls a light blocking period and a light radiation period to the solid state image sensor 504, in accordance with the control of the drive circuit 1005.

The solid state image sensor 504 is configured with a package that includes the above solid state image sensor. The solid state image sensor 504 accumulates a signal electric charge for a certain period, in accordance with the light by which an image is formed on the light receiving surface via the optical system 502 and the shutter device 503. The signal electric charge accumulated in the solid state image sensor 504 is transferred in accordance with a driving signal (a timing signal) supplied from the drive circuit 505.

The drive circuit 505 outputs a driving signal for controlling the transfer operation of the solid state image sensor 504 and the shutter operation of the shutter device 503, in order to drive the solid state image sensor 504 and the shutter device 503.

The signal processing circuit 506 performs various types of signal processing to the signal electric charge output from the solid state image sensor 504. The image (image data) obtained by performing the signal processing by the signal processing circuit 506 is supplied to and displayed on the monitor 507, and is supplied to and stored (recorded) in the memory 508.

Also in the imaging apparatus 501 configured as described above, the size reduction and the height reduction of the device configuration are achieved, and the ghost and the flare due to the internal diffuse reflection are prevented, by applying the image sensor 1 of one of FIG. 1, FIG. 4, FIG. 6 to FIG. 17, instead of the above optical system 502, and the solid state image sensor 504.

16. Usage Examples of Solid-state Imaging Apparatus

FIG. 19 is a diagram illustrating use examples in which the above-described solid-state imaging apparatus 1 is used.

The above-described imaging apparatus 1 can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

17. Application Example to Endoscopic Surgical Operation System

The technology according to an embodiment of the present disclosure (the present technology) can be applied to various products. For example, the technology according to an embodiment of the present disclosure may be applied to an endoscopic surgical operation system.

FIG. 20 is a diagram illustrating an example of a schematic configuration of an endoscopic surgical operation system to which the technology according to an embodiment of the present disclosure (the present technology) is applied.

FIG. 20 illustrates a situation in which a surgeon (doctor) 11131 is using an endoscopic surgery system 11000 to perform surgery on a patient 11132 lying on a patient bed 11133. As illustrated in the diagram, the endoscopic surgery system 11000 is made up of an endoscope 11100, other surgical instruments 11110 such as a pneumoperitoneum tube 11111, an energy treatment tool 11112 or the like, a support arm apparatus 11120 that supports the endoscope 11100, and a cart 11200 on which are provided various apparatuses for endoscopic surgery.

The endoscope 11100 is made up of a lens tube 11101 having a region of certain length from the front end that is inserted into the body cavity of the patient 11132, and a camera head 11102 connected to the base end of the lens tube 11101. In the example illustrated in the diagram, an endoscope 11100 configured as a so-called rigid scope having a rigid lens tube 11101 is illustrated, but the endoscope 11100 may also be configured as a so-called flexible scope having a flexible lens tube 11101.

On the front end of the lens tube 11101, there is provided an opening into which an objective lens is fitted. A light source device 11203 is connected to the endoscope 11100. Light generated by the light source device 11203 is guided up to the front end of the lens tube 11101 by a light guide extending inside the lens tube 11101, and is radiated through the objective lens towards an observation target inside the body cavity of the patient 11132. Note that the endoscope 11100 may be a forward-viewing scope, an oblique-viewing scope, or a side-viewing scope.

An optical system and an image sensor are provided inside the camera head 11102, and reflected light from the observation target (observation light) is condensed onto the image sensor by the optical system. Observation light is photoelectrically converted by the image sensor, and an electrical signal corresponding to the observation light, or in other words, an image signal corresponding to the observed image, is generated. The image signal is transmitted as RAW data to a camera control unit (CCU) 11201.

The CCU 11201 is made up of components such as a central processing unit (CPU) and a graphics processing unit (GPU), and centrally controls the operation of the endoscope 11100 and the display device 11202. Further, the CCU 11201 receives an image signal from the camera head 11102 and subjects the image signal to various types of image processing for displaying an image based on the image signal, such as development process (demosaicing process), for example.

The display device 11202 displays an image based on an image signal to which the image processing is performed by the CCU 11201, by the control from the CCU 11201.

The light source device 11203 is made up of a light source such as a light-emitting diode (LED), for example, and supplies the endoscope 11100 with irradiating light when imaging the operating site or the like.

An input device 11204 is an input interface with respect to the endoscopic surgery system 11000. Through the input device 11204, the user is able to input various information and instructions into the endoscopic surgery system 11000. For example, the user inputs instructions to change the imaging parameters of imaging by the endoscope 11100 (such as the type of irradiating light, the magnification, and the focus distance), and the like.

A treatment tool control device 11205 controls the driving of the energy treatment tool 11112 to cauterize or make incisions into tissue, seal blood vessels, or the like. The pneumoperitoneum device 11206 delivers gas into the body cavity through the pneumoperitoneum tube 11111 to inflate the body cavity of the patient 11132 for the purpose of securing a field of view for the endoscope 11100 and securing a workspace for the surgeon. The recorder 11207 is a device capable of recording various types of information related to surgery. The printer 11208 is a device capable of printing out various types of information related to surgery in various formats, such as text, images, or graphs.

Note that the light source device 11203 which supplies the endoscope 11100 with irradiating light when imaging the operating site may be made up of a white light source configured by an LED, a laser light source, or a combination of the two, for example. At this point, in the case in which the white light source is configured by a combination of RGB laser light sources, the output intensity and output timing of each color (each wavelength) can be controlled with high precision, and thus the white balance of the captured image can be adjusted with the light source device 11203. Also, in this case, by irradiating the observation target with laser light from each of the RGB laser light sources in a time-division manner, and controlling the driving of the image sensor of the camera head 11102 in synchronization with the irradiation timings, it is also possible to capture images corresponding to R, G, and B, respectively, in a time-division manner. According to such a method, color images can be obtained without providing the image sensor with a color filter.

Also, the driving of the light source device 11203 may also be controlled so as to change the intensity of the light to output every time a certain amount of time elapses. By controlling the driving of the image sensor of the camera head 11102 in synchronization with the timings of changing the light intensity to acquire images in a time-division manner, and compositing the images together, it is possible to generate a high dynamic range image without what are called crushed blacks and blown-out whites.

Additionally, the light source device 11203 may also be configured to be able to supply light in a certain wavelength band corresponding to special imaging. With special imaging, for example, the wavelength dependency of light absorption by tissues of the body is utilized, and light is radiated in a narrow band compared to the irradiating light during normal observation (that is, white light) to thereby image certain tissues, such as blood vessels in the superficial portion of the mucous membrane, at a high contrast, also known as narrow band imaging (NBI). Alternatively, with special imaging, fluorescent observation that obtains an image with fluorescent light by radiating excitation light may also be conducted. With fluorescent observation, it is possible to irradiate a body tissue with excitation light and observe fluorescent light from the body tissue (autofluorescence observation), or locally inject a reagent such as indocyanine green (ICG) into a body tissue while also irradiating that body tissue with excitation light corresponding to the fluorescence wavelength of the reagent to obtain a fluorescent image, or the like. The light source device 11203 may be configured to be able to supply narrow-band light and/or excitation light corresponding to such special imaging.

FIG. 21 is a block diagram illustrating an example of a functional configuration of the camera head 11102 and the CCU 11201 illustrated in FIG. 20.

The camera head 11102 includes a lens unit 11401, an imaging unit 11402, a driving unit 11403, a communication unit 11404, and a camera head control unit 11405. The CCU 11204 includes a communication unit 11411, an image processing unit 11412, and a control unit 11413. The camera head 11102 and the CCU 11201 are mutually communicably connected by a transmission cable 11400.

The lens unit 11401 is an optical system provided in the part that connects to the lens tube 11101. Observation light taken in from the front end of the lens tube 11101 is guided up to the camera head 11102, and is incident on the lens unit 11401. The lens unit 11401 is made up of a combination of multiple lenses, including a zoom lens and a focus lens.

The imaging section 11402 is configured with an image sensor. The image sensor that configures the imaging section 11402 may be one (what is called single plate), and may be a plurality (what is called multiplate). When the imaging section 11402 is configured with the multiplate, the image signals corresponding to RGB are generated by the respective image sensors, and those image signals are combined into a color image, for example. Or, the imaging unit 11402 may include a pair of image sensors for respectively acquiring image signals for the right eye and the left eye corresponding to 3D display. By presenting a 3D display, the surgeon 11131 becomes able to grasp the depth of biological tissue at the operating site more accurately. Note that if the imaging unit 11402 has a multi-chip configuration, the lens unit 11401 likewise is provided with multiple subsystems corresponding to each of the image sensors.

Also, the imaging unit 11402 is not necessarily provided in the camera head 11102. For example, the imaging unit 11402 may also be provided inside the lens tube 11101, directly behind the objective lens.

The driving unit 11403 is made up of actuators, and under control from the camera head control unit 11405, moves the zoom lens and the focus lens of the lens unit 11401 by a certain distance along the optical axis. With this arrangement, the magnification and the focus of the image captured by the imaging unit 11402 may be adjusted appropriately.

The communication unit 11404 is configured with a communication device for transmitting and receiving various types of information with the CCU 11201. The communication unit 11404 transmits the image signal obtained from the imaging section 11402 to the CCU 11201 via the transmission cable 11400 as raw data.

Also, the communication unit 11404 receives from the CCU 11201 a control signal for controlling the driving of the camera head 11102 to supply the control signal to the camera head control unit 11405. The control signal includes information related to imaging parameters, such as information specifying the frame rate of the captured image, information specifying the exposure value during imaging, and/or information specifying the magnification and focus of the captured image, for example.

Note that the above imaging parameters such as the frame rate, the exposure value, the magnification, and the focus may be set by a user appropriately, or may be set automatically by the control unit 11413 of the CCU 11201 on the basis of the acquired image signal. In other words, what are called an auto exposure (AE) function, an auto focus (AF) function, and an auto white balance (AWB) function are provided in the endoscope 11100.

The camera head control unit 11405 controls driving of the camera head 11102, on the basis of the control signal from the CCU 11201 which is received via the communication unit 11404.

The communication unit 11411 is made up of a communication device for transmitting and receiving various information to and from the camera head 11102. The communication unit 11411 receives an image signal transmitted from the camera head 11102 through the transmission cable 11400.

Also, the communication unit 11411 transmits a control signal for controlling the driving of the camera head 11102 to the camera head 11102. The image signal and the control signal are transmitted by electrical communication, optical communication, and the like.

The image processing unit 11412 performs various types of image processing to the image signal which is the raw data transmitted from the camera head 11102.

The control unit 11413 performs various types of control relevant to image capturing of a surgical site or the like by the endoscope 11100, and display of the captured image obtained by the image capturing of the surgical site or the like. For example, the control unit 11413 generates a control signal for controlling driving of the camera head 11102.

In addition, the control unit 11413 causes the display device 11202 to display a captured image on which the operating site or the like is reflected on the basis of the image signal subjected to image processing by the image processing unit 11412. At this point, the control unit 11413 may use any of various types of image recognition technology to recognize various objects in the captured image. For example, by detecting features such as the edge shapes and colors of objects included in the captured image, the control unit 11413 is able to recognize surgical instruments such as forceps, a specific site of the body, hemorrhaging, mist during usage of the energy treatment tool 11112, and the like. When causing the display device 11202 to display a captured image, the control unit 11413 may use the recognition results to overlay various surgical assistance information onto the image of the operating site. By overlaying and providing the surgeon 11131 with surgical assistance information, it becomes possible to ease the burden of the surgeon 11131 and to let the surgeon 11131 proceed with surgery reliably.

The transmission cable 11400 that connects the camera head 11102 and the CCU 11201 is an electrical signal cable supporting the communication of electrical signals, optical fiber supporting optical communication, or a composite cable of the above.

At this point, in the illustrated example, communication is conducted in a wired manner using the transmission cable 11400, but communication between the camera head 11102 and the CCU 11201 may also be conducted wirelessly.

In the above, an example of the endoscopic surgical operation system to which the technology according to an embodiment of the present disclosure is applied has been described. The technology according to an embodiment of the present disclosure can be applied to the endoscope 11100, the camera head 11102 (the imaging section 11402), the CCU 11201 (the image processing unit 11412), or the like, among the configuration described above, for example. Specifically, the imaging apparatus 1 of FIG. 1, FIG. 4, FIG. 6 to FIG. 17 can be applied to the lens unit 11401 and the imaging section 10402, for example. The size reduction and the height reduction of the device configuration are achieved, and the occurrence of the flare and the ghost due to the internal diffuse reflection is prevented, by applying the technology according to an embodiment of the present disclosure to the lens unit 11401 and the imaging section 10402.

Although the endoscopic surgical operation system has been described here as an example, the technology according to an embodiment of the present disclosure may be applied to other systems, such as a microscope surgical operation system or the like.

18. Application Example to Mobile Object

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

FIG. 22 is a block diagram illustrating a schematic configuration example of a vehicle control system which is an example of a mobile object control system to which a technology according to an embodiment of the present technology is applicable.

A vehicle control system 12000 includes a plurality of electronic control units connected via a communication network 12001. In the example illustrated in FIG. 22, the vehicle control system 12000 includes a drive line control unit 12010, a body system control unit 12020, a vehicle outside information detection unit 12030, a vehicle inside information detection unit 12040, and an integrated control unit 12050. In addition, as functional configurations of the integrated control unit 12050, a micro-computer 12051, an audio and image output section 12052, an in-vehicle network interface (I/F) 12053.

The drive line control unit 12010 controls the operation of devices related to the drive line of the vehicle in accordance with a variety of programs. For example, the drive line control unit 12010 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like.

The body system control unit 12020 controls the operations of a variety of devices attached to the vehicle body in accordance with a variety of programs. For example, the body system control unit 12020 functions as a control device for a keyless entry system, a smart key system, a power window device, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 receives these radio waves or signals, and controls the vehicle door lock device, the power window device, the lights, or the like.

The vehicle outside information detection unit 12030 detects information regarding the outside of a vehicle on which the vehicle control system 12000 is mounted. For example, an imaging section 12031 is connected to the vehicle outside information detection unit 12030. The vehicle outside information detection unit 12030 causes the imaging section 12031 to capture an image outside of the vehicle and receives the captured image. The vehicle outside information detection unit 12030 may perform an object detection process or a distance detection process for a person, a vehicle, an obstacle, a sign, letters on a road, or the like on the basis of the received image.

The imaging section 12031 is a light sensor that receives light and outputs an electric signal in accordance with the amount of received light. The imaging section 12031 can output the electric signal as an image or distance measurement information. In addition, the light received by the imaging section 12031 may be the visible light or may be non-visible light such as infrared light.

The vehicle inside information detecting unit 12040 detects information on the inside of the vehicle. The vehicle inside information detecting unit 12040 is connected, for example, to a driver state detecting section 12041 that detects the state of the driver. The driver state detecting section 12041 may include, for example, a camera that images the driver. The vehicle inside information detecting unit 12040 may compute the degree of the driver's tiredness or the degree of the driver's concentration or determine whether the driver have a doze, on the basis of detection information input from the driver state detecting section 12041.

For example, the microcomputer 12051 can calculate a control target value of the driving force generating device, the steering mechanism, or the braking device on the basis of information acquired by the vehicle outside information detecting unit 12030 or the vehicle inside information detecting unit 12040 on the inside and outside of the vehicle, and output a control instruction to the drive line control unit 12010. For example, the microcomputer 12051 may perform cooperative control for the purpose of executing the functions of an advanced driver assistance system (ADAS) including vehicle collision avoidance or impact reduction, follow-up driving based on the intervehicle distance, constant vehicle speed driving, vehicle collision warning, vehicle lane departure warning, or the like.

Further, the microcomputer 12051 can control the driving force generating device, the steering mechanism, the braking device, or the like on the basis of information acquired by the vehicle outside information detecting unit 12030 or the vehicle inside information detecting unit 12040 on the areas around the vehicle, thereby performing cooperative control for the purpose of automatic driving or the like that allows the vehicle to autonomously travel irrespective of any operation of a driver.

In addition, the microcomputer 12051 can output a control instruction to the body system control unit 12020 on the basis of the information regarding the outside of the vehicle acquired by the vehicle outside information detection unit 12030. For example, the microcomputer 12051 can control a head lamp in accordance with the position of a preceding vehicle or an oncoming vehicle detected by the vehicle outside information detection unit 12030 and can perform cooperative control for the purpose of anti-glaring such as switching a high beam to a low beam.

The audio and image output section 12052 transmits an output signal of at least one of a sound and an image to an output device capable of visually or aurally notifying a passenger of the vehicle or the outside of the vehicle of information. In the example of FIG. 22, an audio speaker 12061, a display section 12062, and an instrument panel 12063 are exemplified as the output device. For example, the display section 12062 may include at least one of an onboard display and a head-up display.

FIG. 23 is a diagram illustrating an example of an installation position of the imaging section 12031.

In FIG. 23, the vehicle 12100 includes imaging sections 12101, 12102, 12103, 12104, and 12105 as the imaging section 12031.

Imaging sections 12101, 12102, 12103, 12104, and 12105 are positioned, for example, at the front nose, a side minor, the rear bumper, the back door, and the upper part of the windshield in the vehicle compartment of a vehicle 12100. The imaging section 12101 attached to the front nose and the imaging section 12105 attached to the upper part of the windshield in the vehicle compartment chiefly acquire images of the area ahead of the vehicle 12100. The imaging sections 12102 and 12103 attached to the side minors chiefly acquire images of the areas on the sides of the vehicle 12100. The imaging section 12104 attached to the rear bumper or the back door chiefly acquires images of the area behind the vehicle 12100. The image of the front side obtained by the imaging sections 12101 and 12105 is used chiefly to detect a preceding vehicle, a pedestrian, an obstacle, a traffic light, a traffic sign, a lane, or the like.

Additionally, FIG. 23 illustrates an example of the imaging ranges of the imaging sections 12101 to 12104. An imaging range 12111 represents the imaging range of the imaging section 12101 attached to the front nose. Imaging ranges 12112 and 12113 respectively represent the imaging ranges of the imaging sections 12102 and 12103 attached to the side minors. An imaging range 12114 represents the imaging range of the imaging section 12104 attached to the rear bumper or the back door. For example, overlaying image data captured by the imaging sections 12101 to 12104 offers an overhead image that looks down on the vehicle 12100.

At least one of the imaging sections 12101 to 12104 may have a function of acquiring distance information. For example, at least one of the imaging sections 12101 to 12104 may be a stereo camera including a plurality of image sensors or may be an image sensor that includes pixels for phase difference detection.

For example, the microcomputer 12051 can extract a 3-dimensional object traveling at a predetermined speed (for example, 0 or more km/h) in substantially the same direction as the vehicle 12100 as a preceding vehicle by particularly using a closest 3-dimensional object on a travel road of the vehicle 12100 by obtaining a distance to each 3-dimensional object within the imaging ranges 12111 to 12114 and a temporal change in the distance (a relative speed to the vehicle 12100) on the basis of distance information obtained from the imaging sections 12101 to 12104. Further, the micro-computer 12051 can set an inter-vehicle distance to be ensured in advance before a preceding vehicle and perform automatic brake control (also including follow-up stop control) or automatic acceleration control (also including follow-up oscillation control). In this way, it is possible to perform cooperative control for the purpose of automatic driving or the like that allows the vehicle to autonomously travel irrespective of any operation of a driver.

For example, the microcomputer 12051 can classify and extract 3-dimensional object data regarding 3-dimensional objects as other 3-dimensional objects such as motorcycles, normal vehicles, large vehicles, pedestrians, and electric poles on the basis of the distance information obtained from the imaging sections 12101 to 12104 and can use the other 3-dimensional objects to automatically avoid obstacles. For example, the microcomputer 12051 identifies obstacles around the vehicle 12100 as obstacles which can be viewed by a driver of the vehicle 12100 and obstacles which are difficult to view. Then, the microcomputer 12051 can determine a collision risk indicating a danger of collision with each obstacle and output a warning to the driver via the audio speaker 12061 or the display section 12062 in a situation in which there is a collision possibility since the collision risk is set to be equal to or greater than a set value or can perform driving assistance for collision avoidance by performing forced deceleration or avoidance steering via the drive line control unit 12010.

At least one of the imaging sections 12101 to 12104 may be an infrared camera that detects infrared light. For example, the microcomputer 12051 can recognize a pedestrian by determining whether there is the pedestrian in captured images of the imaging sections 12101 to 12104. The pedestrian can be recognized, for example, in a procedure in which feature points are extracted in the captured images of the imaging sections 12101 to 12104 serving as infrared cameras and a procedure in which a series of feature points indicating a contour of an object are subjected to a pattern matching process to determine whether there is the pedestrian. The microcomputer 12051 determines that there is the pedestrian in the captured images of the imaging sections 12101 to 12104. When the pedestrian is recognized, the audio and image output section 12052 controls the display section 12062 such that a rectangular contour line for emphasis is superimposed to be displayed on the recognized pedestrian. In addition, the audio and image output section 12052 controls the display section 12062 such that an icon or the like indicating the pedestrian is displayed at a desired position.

The example of the vehicle control system to which the technology according to an embodiment of the present disclosure can be applied has been described above. The technology according to an embodiment of the present disclosure can be applied to the imaging section 12031 in the above-described configuration. Specifically, the imaging apparatus 1 of FIG. 1, FIG. 4, FIG. 6 to FIG. 17 can be applied to the imaging section 12031, for example. The size reduction and the height reduction of the device configuration are achieved, and the occurrence of the flare and the ghost due to the internal diffuse reflection is prevented, by applying the technology according to an embodiment of the present disclosure to the imaging section 12031.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

<1>
An imaging apparatus including:
a solid state image sensor configured to generate a pixel signal by photoelectric conversion in accordance with a light amount of an incoming light;
an integrated configuration unit configured to integrate a function for fixing the solid state image sensor and a function for removing an infrared light of the incoming light.

<2>
The imaging apparatus according to <1>, in which
the integrated configuration unit is configured by integrating a glass substrate that fixes the solid state image sensor and an infrared cut filter that cuts the infrared light of the incoming light.

<3>
The imaging apparatus according to <2>, in which
the glass substrate is attached, by a transparent bonding adhesive, to a light receiving surface side of the incoming light of the solid state image sensor,
the infrared cut filter is attached, by the transparent bonding adhesive, to a surface of an opposite side to a surface of the glass substrate to which the solid state image sensor is attached, and
the transparent bonding adhesive has a substantially same refractive index as a refractive index in the solid state image sensor, the glass substrate, and an infrared cut filter.

<4>
The imaging apparatus according to <3>, in which
a protruding portion is provided around the glass substrate, the protruding portion is attached by the bonding adhesive so as to face the solid state image sensor, and thereby a hollow space of an air layer is provided in a space between the glass substrate and the solid state image sensor.

<5>
The imaging apparatus according to <2>, in which
the infrared cut filter is attached, by a transparent bonding adhesive, to a light receiving surface side of the incoming light of the solid state image sensor,
the glass substrate is attached, by the transparent bonding adhesive, to a surface of an opposite side to a surface of the infrared cut filter to which the solid state image sensor is attached, and the transparent bonding adhesive has a substantially same refractive index as a refractive index in the solid state image sensor, the glass substrate, and an infrared cut filter.

<6>

The imaging apparatus according to <2>, further including:
a lens group composed of a plurality of lenses that focuses the incoming light to a light receiving surface of the solid state image sensor,
in which the integrated configuration unit locates a lowest layer lens group composed of lenses that composes a lowest layer in an incidence direction of the incoming light, among the lens group, at a most prior stage in a direction for receiving the incoming light.

<7>

The imaging apparatus according to <6>, in which the lowest layer lens group is attached by a transparent bonding adhesive.

<8>

The imaging apparatus according to <6>, in which the lowest layer lens group is composed of at least one lens.

<9>

The imaging apparatus according to <6>, in which a reflection prevention process for preventing reflection of a light reflected from the solid state image sensor is performed to the lowest layer lens group.

<10>

The imaging apparatus according to <9>, in which an anti-reflection (AR) coat is applied on a surface of the lowest layer lens group that faces the incidence direction, as the reflection prevention process for preventing the reflection of the light reflected from the solid state image sensor.

<11>

The imaging apparatus according to <9>, in which a surface of the lowest layer lens group that faces the incidence direction has a moth-eye structure, as the reflection prevention process for preventing the reflection of the light reflected from the solid state image sensor.

<12>

The imaging apparatus according to <6>, further including:
an actuator configured to adjust a focus position by moving forward and backward in an optical axis the lens group composed of the plurality of lenses that focuses the incoming light, in relation to the light receiving surface of the solid state image sensor.

<13>

The imaging apparatus according to <2>, in which the infrared cut filter is a soda lime glass.

<14>

The imaging apparatus according to <2>, in which the infrared cut filter is an infrared light cut resin.

<15>

The imaging apparatus according to <2>, in which the infrared cut filter is an infrared light cut coating material made of an organic multilayer film.

<16>

The imaging apparatus according to <2>, in which a black mask is applied on a peripheral part of the glass substrate.

<17>

The imaging apparatus according to any of <1> to <16>, in which
the integrated configuration unit is an infrared light cut glass having a function for cutting the infrared light of the incoming light and made of a glass substrate that fixes the solid state image sensor.

<18>

The imaging apparatus according to <1>, in which the integrated configuration unit includes
a glass substrate that fixes the solid state image sensor, and
a lowest layer lens group composed of lenses that compose a lowest layer in an incidence direction of the incoming light, among a lens group composed of a plurality of lenses, which has a function for focusing the incoming light on a light receiving surface of the solid state image sensor and a function for cutting the infrared light of the incoming light,
in which the lowest layer lens group is located at a most prior stage in a direction for receiving the incoming light.

<19>

The imaging apparatus according to <1>, in which the solid state image sensor has a chip size package (CSP) structure or a chip on board (COB) structure.

<20>

An electronic device including:
a solid state image sensor configured to generate a pixel signal by photoelectric conversion in accordance with a light amount of an incoming light; and
an integrated configuration unit configured to integrate a function for fixing the solid state image sensor and a function for removing an infrared light of the incoming light.

<21>

A camera module having an imaging apparatus, the imaging apparatus comprising a circuit substrate; an image sensor mounted with the circuit substrate in an integrated assembly; a glass substrate mounted with the image sensor in the integrated assembly;
an attenuating infrared optical element covering the image sensor and mounted with the image sensor in the integrated assembly; and an adhesive layer bonding the glass substrate or the attenuating infrared optical element to the image sensor.

<22>

The camera module of <21>, wherein the image sensor is bonded to the glass substrate and is included in a chip size package.

<23>

The camera module of <21>, wherein a first lens of a plurality of lenses is attached to the integrated assembly and not positioned by an actuator.

<24>

The camera module of <23>, wherein the first lens of the plurality of lenses and the infrared optical element are bonded together by a transparent optical adhesive.

<25>

The camera module of <23>, further comprising an anti-reflection coating on the first lens.

<26>

The camera module of <23>, further comprising a moth-eye structure on the first lens.

<27>

The camera module of <23>, wherein the infrared optical element is integrated in the first lens.

<28>
The camera module of <21>, wherein plural lenses are attached to the integrated assembly and not positioned by an actuator.

<29>
The camera module of <21>, wherein the infrared optical element is bonded to the image sensor.

<30>
The camera module of <29>, wherein the image sensor comprises a chip on board structure that is connected to the circuit substrate with wire bonds.

<31>
The camera module of <21>, wherein the infrared optical element is located between the glass substrate and the image sensor.

<32>
The camera module of <21>, wherein the infrared optical element comprises infrared light cut resin.

<33>
The camera module of <21>, wherein the glass substrate has protrusions at its periphery that contact the image sensor and form a cavity between the image sensor and an interior region of the glass substrate.

<34>
The camera module of <21>, wherein the infrared optical element comprises an organic multilayer film coating located on the glass substrate.

<35>
The camera module of <21>, further comprising a black mask formed around a periphery of the glass substrate.

<36>
An imaging device comprising a glass substrate; an image sensor mounted with the glass substrate in an integrated assembly; an attenuating infrared optical element covering the image sensor and mounted with the image sensor in the integrated assembly; and an adhesive layer bonding the glass substrate or the attenuating infrared optical element to the image sensor.

<37>
An electronic apparatus comprising: a circuit substrate; an image sensor mounted with the circuit substrate in an integrated assembly; a glass substrate mounted with the image sensor in the integrated assembly; an attenuating infrared optical element covering the image sensor and mounted with the image sensor in the integrated assembly; a signal processing circuit arranged to receive signals from the image sensor; memory arranged to store image data; a monitor arranged to display image data; and a drive circuit configured to control transfer of signal electric charges in the image sensor.

REFERENCE SIGNS LIST 1 imaging apparatus
11 solid state image sensor (of CPS structure)
12 glass substrate
13 bonding adhesive
14 infrared cut filter (IRCF)
14' IRCF glass substrate
15 bonding adhesive
16 lens group
17 circuit substrate
18 actuator
19 connector
20 spacer
31 lens
51 bonding adhesive
71 lens group
91 solid state image sensor (of COB structure)
92 wire bond
111 infrared light cut resin
131 glass substrate
131a protruding portion
131b hollow space (cavity)
151 coating material having an infrared light cut function
171 lens
171a AR coat
191 lens
191a reflection prevention processing unit
201 infrared light cut lens
221 glass substrate

The invention claimed is:

1. A camera module having an imaging apparatus, the imaging apparatus comprising:
   a circuit substrate;
   an image sensor mounted with the circuit substrate in an integrated assembly;
   a glass substrate mounted with the image sensor in the integrated assembly;
   an attenuating infrared optical element covering the image sensor and mounted with the image sensor in the integrated assembly; and
   an adhesive layer directly bonding the glass substrate or the attenuating infrared optical element to the image sensor, wherein the adhesive layer has substantially the same refractive index as the glass substrate.

2. The camera module of claim 1, wherein the image sensor is bonded to the glass substrate and is included in a chip size package.

3. The camera module of claim 1, wherein a first lens of a plurality of lenses is attached to the integrated assembly and not positioned by an actuator.

4. The camera module of claim 3, wherein the first lens of the plurality of lenses and the infrared optical element are bonded together by a transparent optical adhesive.

5. The camera module of claim 3, further comprising an anti-reflection coating on the first lens.

6. The camera module of claim 3, further comprising a moth-eye structure on the first lens.

7. The camera module of claim 3, wherein the infrared optical element is integrated in the first lens.

8. The camera module of claim 1, wherein plural lenses are attached to the integrated assembly and not positioned by an actuator.

9. The camera module of claim 1, wherein the infrared optical element is bonded to the image sensor.

10. The camera module of claim 1, wherein the image sensor comprises a chip on board structure that is connected to the circuit substrate with wire bonds.

11. The camera module of claim 1, wherein the infrared optical element is located between the glass substrate and the image sensor.

12. The camera module of claim 1, wherein the infrared optical element comprises infrared light cut resin.

13. The camera module of claim 1, wherein the glass substrate has protrusions at its periphery that contact the image sensor and form a cavity between the image sensor and an interior region of the glass substrate.

14. The camera module of claim 1, wherein the infrared optical element comprises an organic multilayer film coating located on the glass substrate.

15. The camera module of claim 1, further comprising a black mask formed around a periphery of the glass substrate.

16. An imaging device comprising:

a glass substrate;

an image sensor mounted with the glass substrate in an integrated assembly;

an attenuating infrared optical element covering the image sensor and mounted with the image sensor in the integrated assembly; and an adhesive layer directly bonding the glass substrate or the attenuating infrared optical element to the image sensor, wherein the adhesive layer has substantially the same refractive index as the glass substrate.

17. An electronic apparatus comprising:

a circuit substrate;

an image sensor mounted with the circuit substrate in an integrated assembly;

a glass substrate mounted with the image sensor in the integrated assembly;

an attenuating infrared optical element covering the image sensor and mounted with the image sensor in the integrated assembly;

an adhesive layer directly bonding the glass substrate or the attenuating infrared optical element to the image sensor, wherein the adhesive layer has substantially the same refractive index as the glass substrate;

a signal processing circuit arranged to receive signals from the image sensor;

memory arranged to store image data;

a monitor arranged to display image data; and a drive circuit configured to control transfer of signal electric charges in the image sensor.

* * * * *